(12) United States Patent
Sharpe-Geisler

(10) Patent No.: US 10,148,472 B2
(45) Date of Patent: Dec. 4, 2018

(54) CLOCK RECOVERY AND DATA RECOVERY FOR PROGRAMMABLE LOGIC DEVICES

(71) Applicant: Lattice Semiconductor Corporation, Portland, OR (US)

(72) Inventor: Bradley Sharpe-Geisler, San Jose, CA (US)

(73) Assignee: Lattice Semiconductor Corporation, Portland, OR (US)

(*) Notice: Subject to any disclaimer, the term of this patent is extended or adjusted under 35 U.S.C. 154(b) by 0 days.

(21) Appl. No.: 15/700,076

(22) Filed: Sep. 8, 2017

(65) Prior Publication Data

US 2018/0069736 A1 Mar. 8, 2018

Related U.S. Application Data

(60) Provisional application No. 62/385,247, filed on Sep. 8, 2016, provisional application No. 62/385,359, filed on Sep. 9, 2016, provisional application No. 62/385,437, filed on Sep. 9, 2016, provisional application No. 62/452,213, filed on Jan. 30, 2017.

(51) Int. Cl.
*H04L 27/00* (2006.01)
*H03M 9/00* (2006.01)
*G06F 13/38* (2006.01)

(52) U.S. Cl.
CPC .......... *H04L 27/0014* (2013.01); *H03M 9/00* (2013.01); *G06F 13/385* (2013.01); *H04L 2027/0036* (2013.01)

(58) Field of Classification Search
CPC ........ H04L 27/0014; H04L 2027/0036; H03M 9/00; G06F 13/385
USPC .......................................................... 710/71
See application file for complete search history.

(56) References Cited

U.S. PATENT DOCUMENTS

| | | | | |
|---|---|---|---|---|
| 4,513,427 A | * | 4/1985 | Borriello | H03L 7/0805 370/517 |
| 4,817,432 A | * | 4/1989 | Wallace | A61B 3/1005 600/452 |
| 5,015,970 A | * | 5/1991 | Williams | H03L 7/113 327/42 |
| 5,301,196 A | * | 4/1994 | Ewen | H03L 7/091 370/518 |

(Continued)

*Primary Examiner* — Paul R. Myers
(74) *Attorney, Agent, or Firm* — Haynes and Boone, LLP

(57) ABSTRACT

Various techniques are provided to efficiently implement user designs incorporating clock and/or data recovery circuitry and/or a deserializer in programmable logic devices (PLDs). In one example, a method includes receiving a serial data stream, measuring time periods between signal transitions in a serial data stream using at least one Grey code oscillator, and generating a recovered data signal corresponding to the serial data stream by, at least in part, comparing the measured time periods to one or more calibration time periods. In another example, a system includes a Grey code oscillator configured to increment a Grey code count between signal transitions in a serial data stream, and a Grey code converter configured to convert the Grey code count approximately at the signal transitions to a plurality of binary counts each corresponding to a time period between one or more signal transitions in the serial data stream.

20 Claims, 23 Drawing Sheets

(56) References Cited

U.S. PATENT DOCUMENTS

| | | | | | |
|---|---|---|---|---|---|
| 5,671,259 | A | * | 9/1997 | Thomas | H04L 7/027 327/165 |
| 5,838,749 | A | * | 11/1998 | Casper | H03L 7/12 375/376 |
| 5,987,085 | A | * | 11/1999 | Anderson | H03L 7/113 327/157 |
| 6,211,741 | B1 | * | 4/2001 | Dalmia | H03D 13/004 327/147 |
| 6,985,552 | B1 | * | 1/2006 | King | H03M 5/14 375/376 |
| 8,351,559 | B1 | * | 1/2013 | Thomas | H04L 7/0337 375/354 |
| 9,509,319 | B1 | * | 11/2016 | Chattopadhyay | H03L 7/0807 |
| 10,027,332 | B1 | * | 7/2018 | Wang | H03L 7/0891 |
| 2004/0046596 | A1 | * | 3/2004 | Kaeriyama | H03K 5/1534 327/165 |
| 2004/0264612 | A1 | * | 12/2004 | Allen | H03L 7/00 375/354 |
| 2006/0062339 | A1 | * | 3/2006 | Briones | H03D 13/003 375/375 |
| 2009/0180783 | A1 | * | 7/2009 | Huang | H04L 7/0338 398/155 |
| 2012/0163519 | A1 | * | 6/2012 | Choudhury | H04L 7/033 375/354 |
| 2015/0270943 | A1 | * | 9/2015 | Liu | H04L 7/0276 375/371 |

* cited by examiner

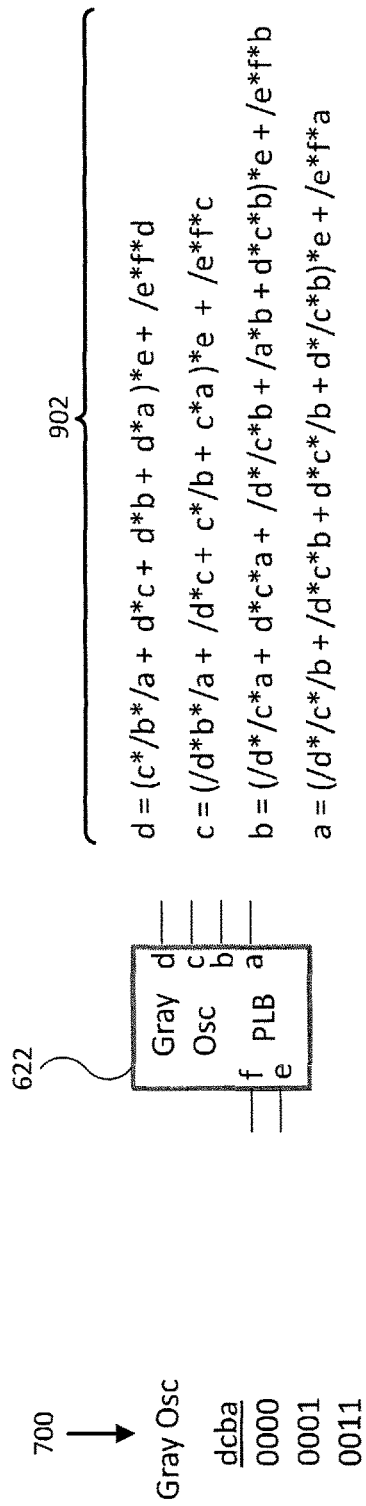
700 →
| Gray Osc |
|---|
| dcba |
| 0000 |
| 0001 |
| 0011 |
| 0010 |
| 0110 |
| 0111 |
| 0101 |
| 0100 |
| 1100 |
| 1101 |
| 1111 |
| 1110 |
| 1010 |
| 1011 |
| 1001 |
| 1000 |
FIG. 7
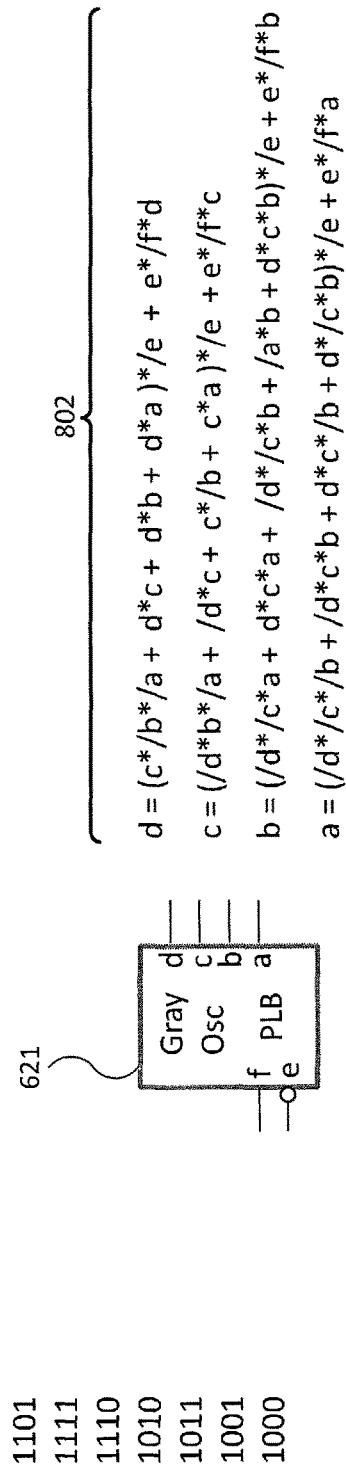
621
802 {
d = (c*/b*/a + d*c + d*b + d*a)*/e + e*/f*d
c = (/d*b*/a + /d*c + c*/b + c*a)*/e + e*/f*c
b = (/d*/c*a + d*c*a + /d*/c*b + /a*b + d*c*b)*/e + e*/f*b
a = (/d*/c*b + /d*c*b + d*c*b + d*/c*b)*/e + e*/f*a
}
FIG. 8
622
902 {
d = (c*/b*/a + d*c + d*b + d*a)*e + /e*f*d
c = (/d*b*/a + /d*c + c*/b + c*a)*e + /e*f*c
b = (/d*/c*a + d*c*a + /d*/c*b + /a*b + d*c*b)*e + /e*f*b
a = (/d*/c*b + /d*c*b + d*c*b + d*/c*b)*e + /e*f*a
}
FIG. 9

CLOCK RECOVERY AND DATA RECOVERY FOR PROGRAMMABLE LOGIC DEVICES

CROSS-REFERENCE TO RELATED APPLICATIONS

This patent application claims priority to and the benefit of U.S. Provisional Patent Application 62/385,247 filed Sep. 8, 2016 and entitled "CDR IN PROGRAMMABLE LOGIC," U.S. Provisional Patent Application 62/385,359 filed Sep. 9, 2016 and entitled "CDR IN PROGRAMMABLE LOGIC," U.S. Provisional Patent Application 62/385,437 filed Sep. 9, 2016 and entitled "CDR IN PROGRAMMABLE LOGIC," and U.S. Provisional Patent Application 62/452,213 filed Jan. 30, 2017 and entitled "CDR IN PLB," which are all hereby incorporated by reference in their entirety.

TECHNICAL FIELD

The present invention relates generally to programmable logic devices and, more particularly, to clock and/or data recovery in programmable logic devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

PLDs are commonly used to deserialize serialized input data streams, and, as a result, are often implemented with a limited number of dedicated deserializer blocks that can be used to recover or extract serialized data from input data streams. However, such blocks require significant area in order to be implemented in a PLD, and there are correspondingly limited routing resources that can be used to implement user designs incorporating such dedicated deserializer blocks. Moreover, such blocks often employ a phase locked loop or an accurate clock to oversample the data stream, which can present a significant timing burden on general routing and, in particular, clock-related circuitry, all of which can be in limited supply in a relatively inexpensive PLD. Such constraints can severely limit the scope of user designs that can be implemented in PLDs, can result in degraded PLD performance, and can significantly increase the time and processing resources needed to determine connection routings for the PLD.

BRIEF DESCRIPTION OF THE DRAWINGS

FIGS. 7-9 illustrate a Grey code oscillator implementation for a PLD in accordance with an embodiment of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
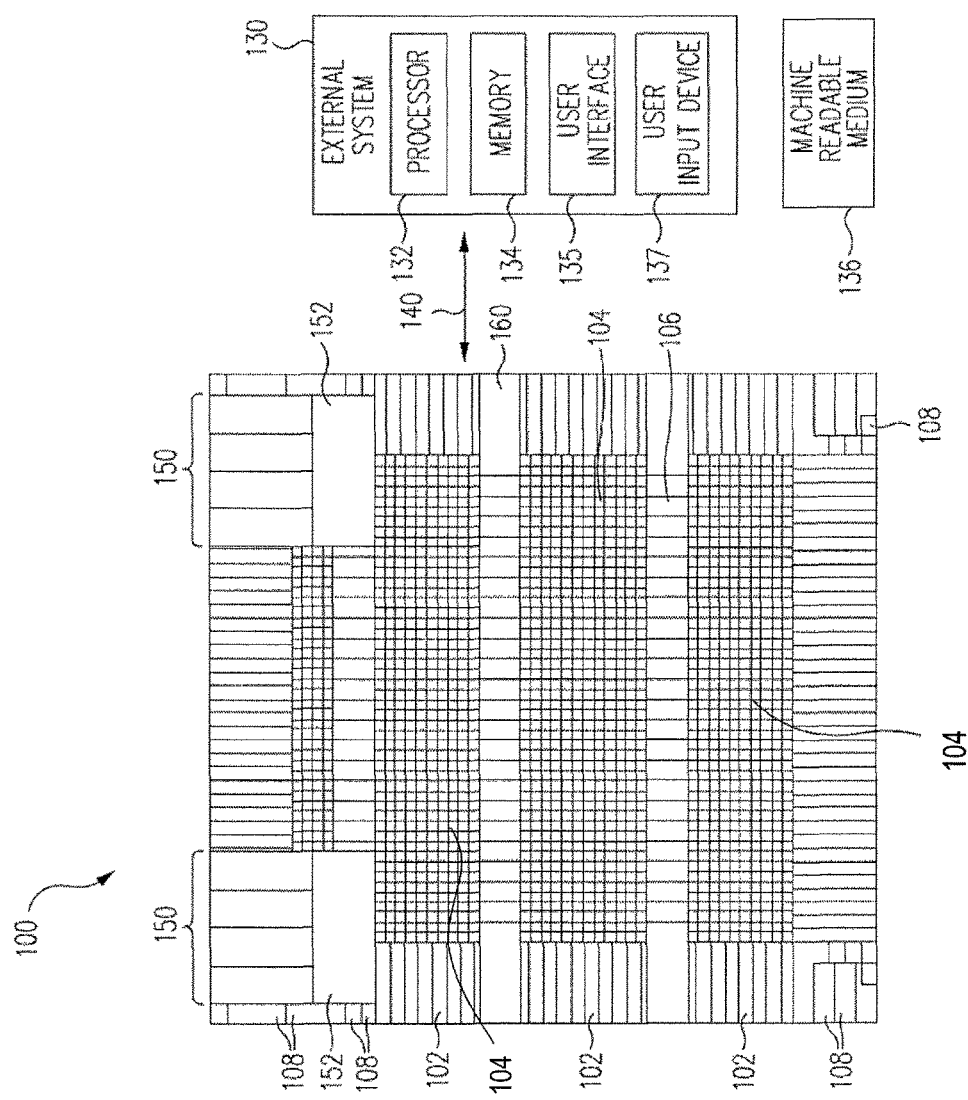
FIG. 1 illustrates a block diagram of a programmable logic device (PLD) in accordance with an embodiment of the disclosure.

In accordance with various embodiments set forth herein, techniques are provided to implement clock and/or data recovery circuitry substantially within configurable (e.g., as opposed to dedicated) logic components of a programmable logic device (PLD). For example, in some embodiments, a PLD includes a plurality of programmable logic blocks (PLBs), memory blocks, digital signal processing blocks, input/output blocks, and/or other components that may be interconnected in a variety of ways to implement a desired circuit design and/or functionality. A circuit design may be represented, at least in part, by a netlist, which can describe components and connections therebetween in the design. For example, a user design may be converted into and/or represented by a netlist including set of PLD components (e.g., configured for logic, arithmetic, clocking, and/or other hardware functions) and associated interconnections available in a PLD. The netlist may be used to place components and/or route connections for the design (e.g., using routing resources of the PLD) with respect to a particular PLD (e.g., using a simulation of the desired circuit design constructed from the netlist).

In general, a PLD (e.g., an FPGA) fabric includes various routing structures and an array of similarly arranged logic cells arranged within programmable function blocks (e.g., PFBs and/or PLBs). The goal in designing a particular type of PLD is to maximize functionality while minimizing area, power, and delay of the fabric. Conventional clock and/or data recovery functionality (e.g., used to extract a clock signal and/or a data signal from a serial data stream, such as a single-ended data stream transmitted without a separate clock signal) is typically implemented by dedicated deserializer blocks that can employ a phase locked loop or an interface to an accurate (e.g., low drift over time) clock and generally take up significant space and particularly limited resources on a typical PLD, as well as dictate collateral timing constraints (e.g., due to delay issues) throughout a user design, all of which work to minimize the functionality of the PLD when used to implement a design incorporating a deserializer block or blocks.

Embodiments of the present disclosure overcome these problems by using generally configurable logic blocks to implement the entirety of the deserializer (e.g., the clock and/or data recovery circuitry). For example, embodiments of the present disclosure use generally configurable logic blocks in a PLD to implement a relatively inaccurate ring type oscillator that can be used to calibrate recovery circuitry (e.g., also implemented in generally configurable logic blocks) to an incoming serial data stream that can then be used to recover a clock signal and/or a data signal from the serial data stream. Because the deserializer block can be implemented using generally configurable logic blocks, a user design incorporating embodiments of the present disclosure can generally be routed more easily, due to the added configuration flexibility, and can incorporate significantly more deserializer functionality than conventional techniques.

While the embodiments described herein present significant improvements in the field of PLD utilization, such designs may also be used in custom built register transfer level (RTL) logic that can be implemented in a general integrated circuit and/or as its own type of dedicated deserializer block in a PLD. Embodiments of the present design have shown significant improvements in the ratio of performance to cost, power, and space utilization, both when implemented in a PLD or in RTL logic for a customized IC. As such, embodiments of the present disclosure should not be viewed as generally limited only to PLD implementations.

Referring now to the drawings, FIG. 1 illustrates a block diagram of a PLD 100 in accordance with an embodiment of the disclosure. In various embodiments, PLD 100 may be implemented as a standalone device, for example, or may be embedded within a system on a chip (SOC), other logic devices, and/or other integrated circuit(s). PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., look up table (LUT) based logic or logic gate array based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock driver sources, PLL circuits, DLL circuits, and/or feedline interconnects), and/or various routing resources (e.g., interconnects and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

In another example, routing resources (e.g., routing resources 180 of FIG. 2) may be used to route connections between components, such as between I/O nodes of logic blocks 104. In some embodiments, such routing resources may include programmable elements (e.g., nodes where multiple routing resources intersect) that may be used to selectively form a signal path for a particular connection between components of PLD 100.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may store such configuration data to memory 134 and/or machine readable medium 136, and/or provide such configuration data to one or more I/O blocks 102, memory blocks 106, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100. In some embodiments, user interface 135 may be adapted to display a netlist, a component placement, a connection routing, hardware description language (HDL) code, and/or other final and/or intermediary representations of a desired circuit design, for example.

Figure 2:
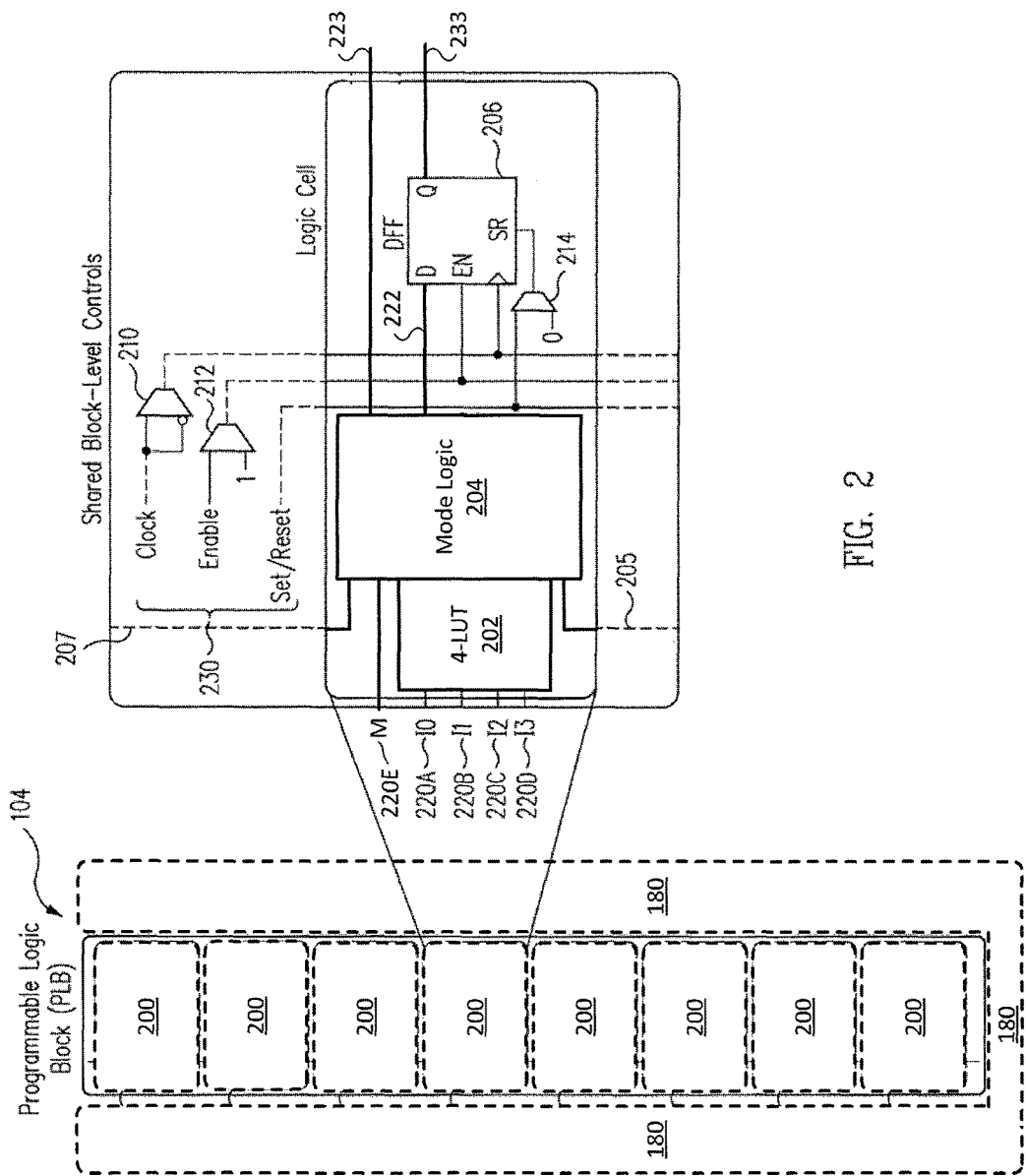
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality, which can also be used to implement one or more clock and/or data recovery deserializers or deserializer blocks, as described herein.

In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode logic 204 may include various logic elements and/or additional inputs, such as input 220E, to support the functionality of various modes for logic cell 200 (e.g., including various clock signal processing and/or functionality modes). LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic and/or other operations that cannot be implemented in a single logic cell 200 (e.g., operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

Figure 3:
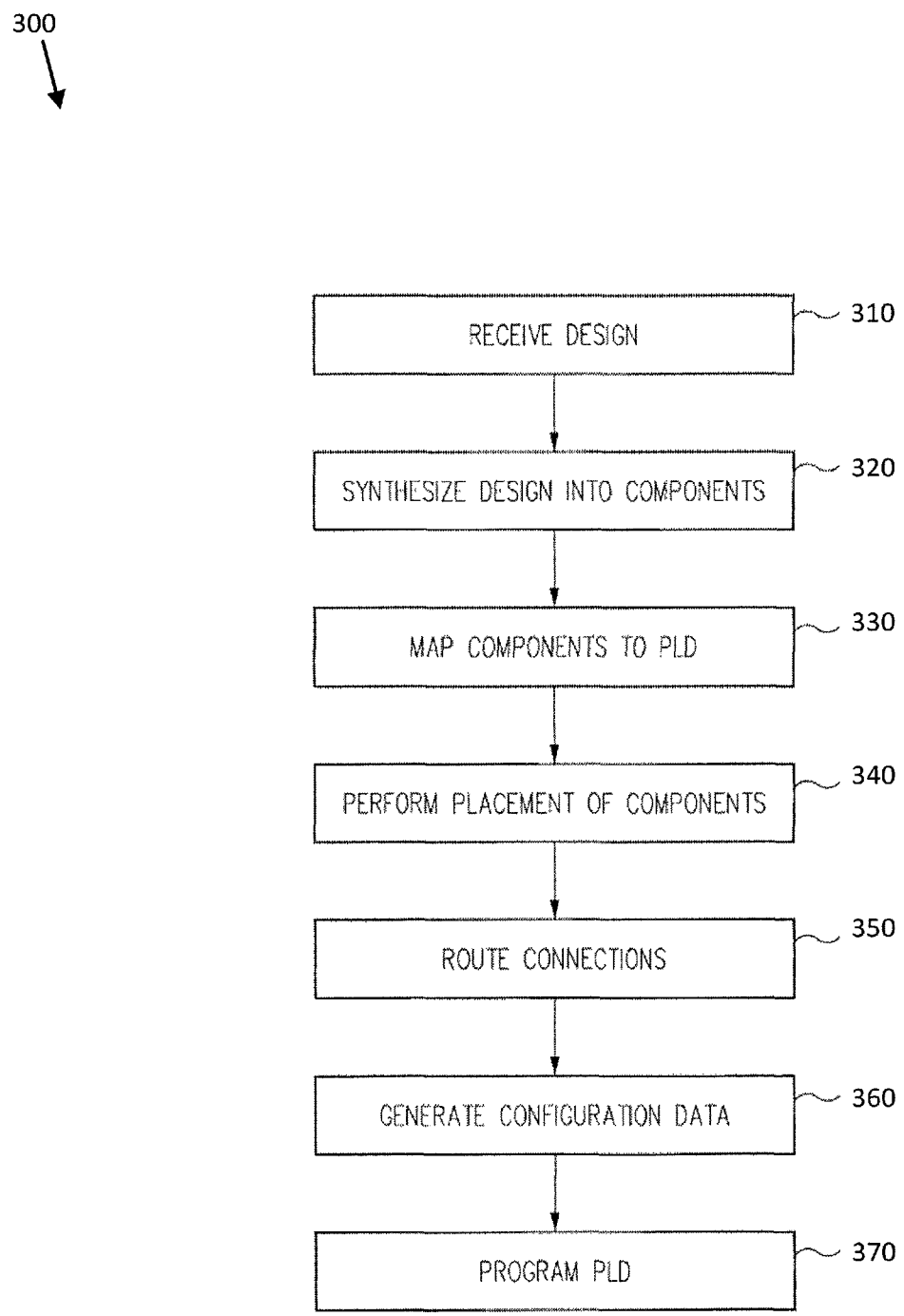
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, I/O and/or SERDES operations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In various embodiments, synthesizing the design may include detecting a serial data stream input and/or a deserializer block configured to generate a recovered data signal corresponding to a payload portion of a serial data stream (e.g., provided by the serial data stream input), for example. In such embodiments, synthesizing such design may include synthesizing the design into a plurality of PLD components configured to implement a Grey code oscillator for the deserializer block that is configured to measure time periods between signal transitions in the serial data stream, as described herein, and at least one comparator for the deserializer block that is configured to compare the measured time periods provided by the Grey code oscillator to one or more calibration time periods to generate the recovered data signal.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing routing connections identified in a user design. For example, the optimization process may include detecting connections with timing errors in the user design, and interchanging and/or adjusting PLD resources implementing the invalid connections and/or other connections to reduce the number of PLD components and/or routing resources used to implement the connections and/or to reduce the propagation delay associated with the connections.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, clock-related circuitry 108, routing resources 180, and/or other physical components of PLD 100), and thus determine a layout for the PLD 100. In some embodiments, the placement may be performed in memory on data retrieved from one or more previously-stored NCD files, for example, and/or on one or more previously-stored NCD files, with the placement results stored (e.g., in memory 134 and/or machine readable medium 136) as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed in memory on data retrieved from one or more previously-stored NCD files, for example, and/or on one or more previously-stored NCD files, with the routing results stored (e.g., in memory 134 and/or machine readable medium 136) as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing routing connections identified in a user design. For example, the optimization process may include detecting connections with timing errors in the user design, and interchanging and/or adjusting PLD resources implementing the invalid connections and/or other connections to reduce the number of PLD components and/or routing resources used to implement the connections and/or to reduce the propagation delay associated with the connections.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
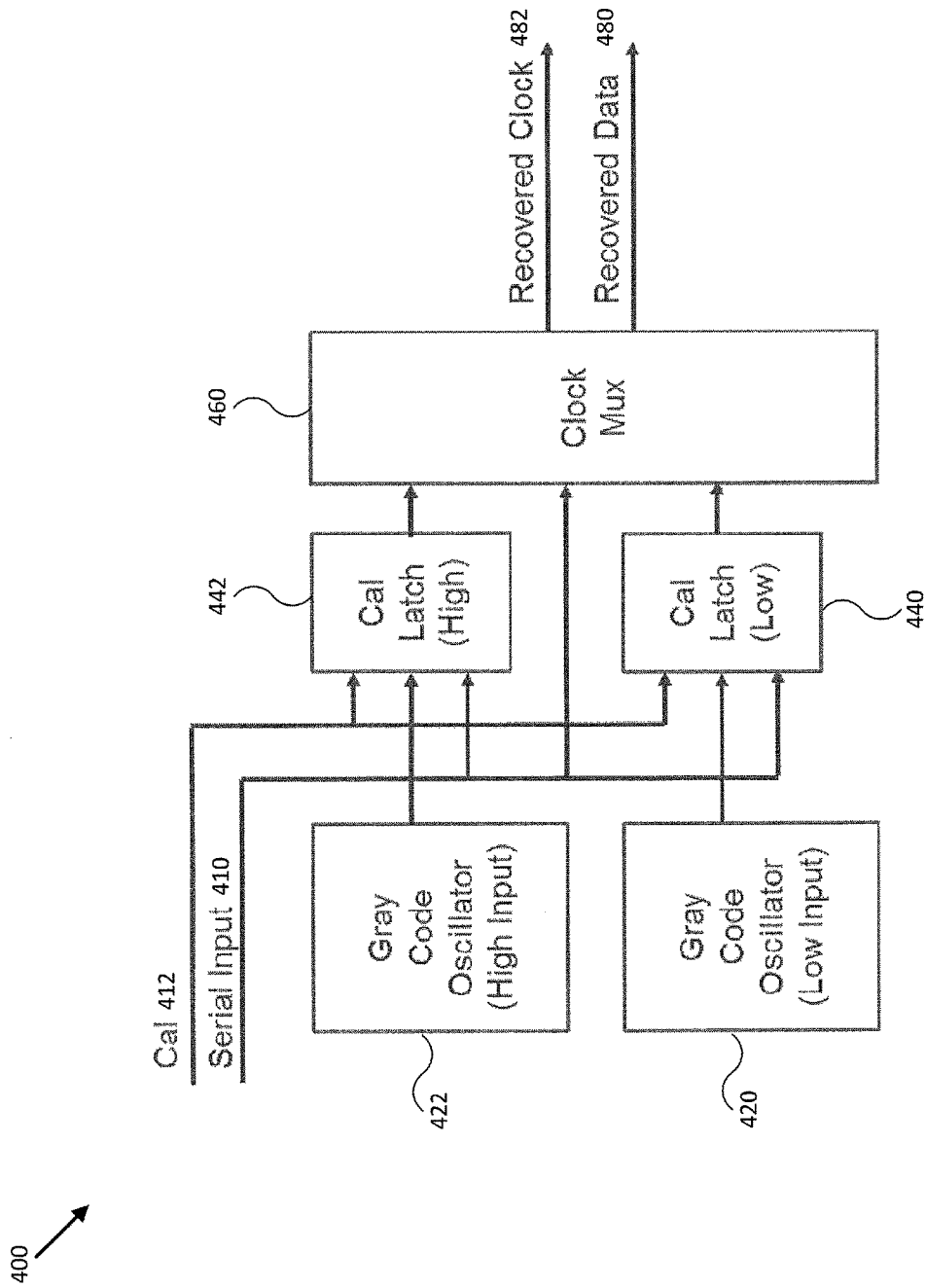
FIG. 4 illustrates a schematic diagram of a clock and/or data recovery deserializer for a PLD in accordance with an embodiment of the disclosure.

FIG. 4 illustrates a schematic diagram of a clock and/or data recovery deserializer 400 for a PLD in accordance with an embodiment of the disclosure. As shown in the embodiment presented by FIG. 4, the general schematic of clock and/or data recovery deserializer (e.g., deserializer circuit or block) 400 includes two asynchronously running Grey code oscillators 420 and 422 providing timing signals to time respective low and high level time periods of serial data stream 410. For example, each of Grey code oscillators 420 and 422 may be implemented as oversampling oscillators (e.g., relative to serial data stream 410) configured to measure time periods between signal transitions in serial data stream 410 (e.g., between negative and adjacent positive signal transitions in serial data stream 410 for Grey code oscillator 420, and between positive and adjacent negative signal transitions in serial data stream 410 for Grey code oscillator 420).

Each Grey code oscillator 420 and 422 may be configured to increment a Grey code count between appropriate signal transitions in serial data stream 410 and provide such counts to calibration latches/storage registers 440 and 442. Calibration signal 412 may be used to cause storage registers 440 and 442 to store calibration time periods (e.g., measured by respective Grey code counts) corresponding to a training preamble or other portion of serial data stream 410 (e.g., when enabled), for example, or to pass payload time periods (e.g., also measured by respective Grey code counts provided by Grey code oscillators 420 and 422) along with the calibration time periods to block 460. Clock and/or data recovery deserializer 400 may optionally be implemented with a single Grey code oscillator that can be used to time both the high and the low time periods, as described herein.

In some embodiments, block 460 may be configured to compare measured payload time periods to calibration time periods and use the result of such comparison to generate recovered data signal 480 and/or recovered clock signal 482. For example, block 460 may be configured to generate a signal transition in recovered clock signal 482 upon a measured payload time period exceeding a corresponding calibration time period, and then to use the signal transition to sample serial data stream 410 to generate recovered data signal 480. In other embodiments, block 460 may be configured compare measured payload time periods to a number of different calibration time periods, for example, and generate recovered data signal based such comparisons. More generally, embodiments of clock and/or data recovery deserializer 400 may be configured to recover and/or decode a data signal from a serial data stream encoded according to a variety of different encoding schemes (e.g., a pulse width modulation encoding, a phase modulation encoding, a pulse width phase modulation encoding, various bit depth encodings, and/or variable bit depth encodings, for example), using an embodiment of Grey code oscillator(s) 420 and/or 422 to measure time periods and/or other signal characteristics associated with the data and/or data encoding transmitted by the serial data stream. Additional implementation details are provided in discussion of FIGS. 6-26.

Figure 5:
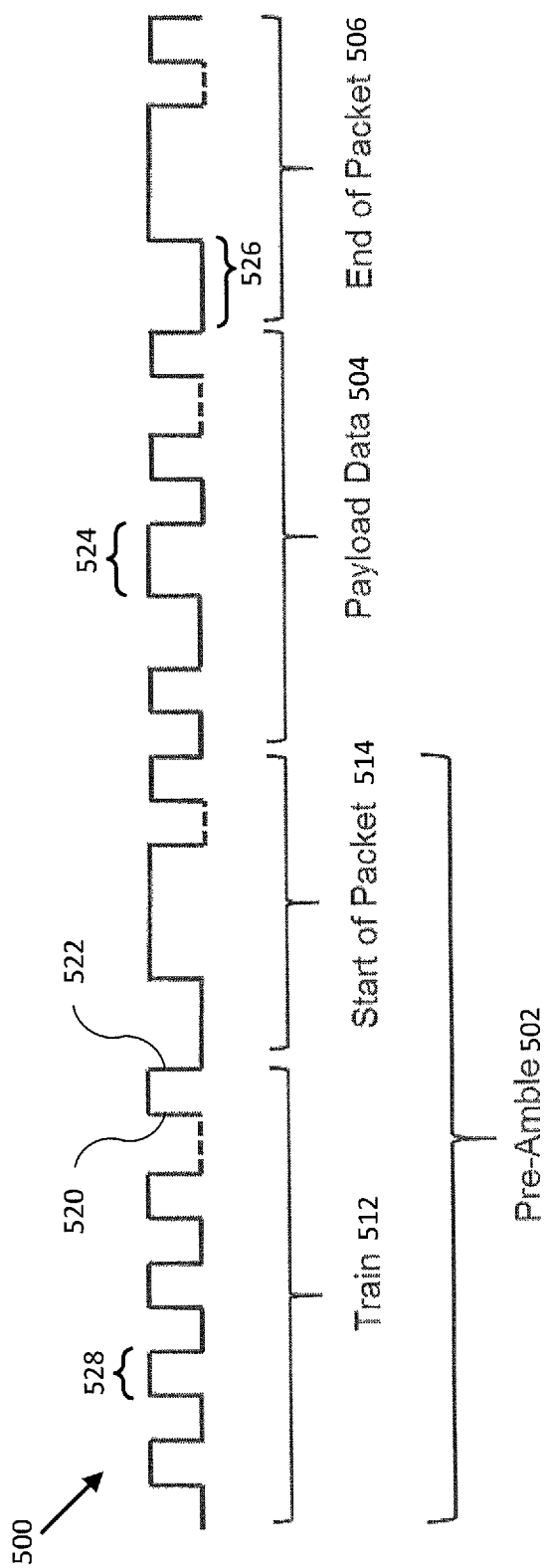
FIG. 5 illustrates a serial data stream packet in accordance with an embodiment of the disclosure.

FIG. 5 illustrates a serial data stream/packet 500 in accordance with an embodiment of the disclosure. As shown in FIG. 5, a typical serial data stream 500 includes a preamble 502 to indicate the beginning of serial data stream 500, a payload portion 504 (e.g., the substantive data being transmitted by the serial data stream), and an end of packet portion 506 to indicate the end of serial data stream 500/payload portion 504. Preamble 502 typically includes a training portion 512 with a known signal transition pattern and length that can be used to calibrate a deserializer/clock and/or data recovery deserializer, as described herein. Start of packet portion 514 may include a known signal transition pattern to indicate the beginning of payload portion 504. For example, clock and/or data recovery deserializer 400 may be configured to use Grey code oscillators 420 and 422 to measure respective low and high time periods between appropriate signal transitions within training portion 512 and to store corresponding low and high calibration time periods in respective storage registers 440 and 442 for later use by block 460.

Also shown in FIG. 5 are positive signal transition 520 (e.g., from low to high), negative signal transition 522 (e.g., from high to low), high time period 524 (e.g., the time period between a positive signal transition and an adjacent negative signal transition), and low time period 526 (e.g., the time period between a negative signal transition and an adjacent positive signal transition). Additionally shown is data cell 528, which may be a length of serial data stream 500 corresponding to the width of a single data bit and/or the width of two adjacent signal transitions in training portion 512.

Figure 6:
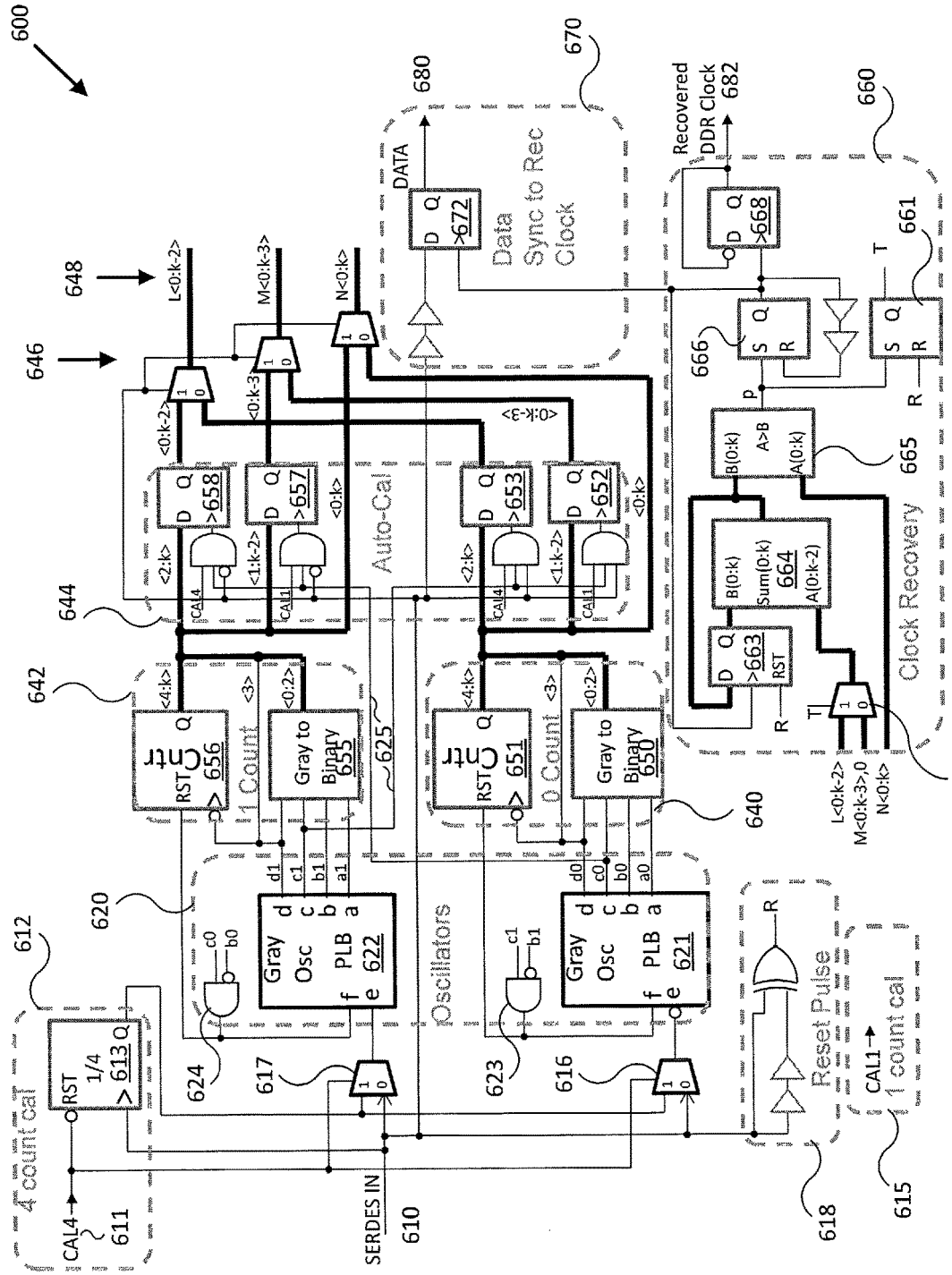
FIG. 6 illustrates a block diagram of a clock and data recovery deserializer for a PLD in accordance with an embodiment of the disclosure.

FIG. 6 illustrates a block diagram of a clock and data recovery deserializer 600 for a PLD in accordance with an embodiment of the disclosure. In general, clock and data recovery deserializer 600 operates similar to clock and data recovery deserializer 400 of FIG. 4, but includes additional functionality to reduce a risk of race and/or other timing issues. In general, clock and data recovery deserializer 600 is configured to receive a serial data stream/input 610, measure time periods between signal transitions corresponding to serial data stream 610, and generate a recovered clock signal/output 682 and a recovered data signal/output 680, and may be implemented entirely with generally configurable resources of a PLD.

As shown in FIG. 6, clock and data recovery deserializer 600 includes calibration signal generators 612 and 615, asynchronous oversampling Grey code oscillators 620, low and high Grey code converters 640 and 642, calibration storage registers 644, clock recovery circuit 660, and data recovery circuit 670. Calibration signal generators 612 and 615 may generally be configured to receive a raw serial data stream (e.g., direct from input 610) and generate and provide a calibration serial data stream to Grey code oscillators 620 while enabled (e.g., by calibration enable signal 611). For example, when calibration enable signal 611 is high, divider block 613 of calibration signal generator 612 may be configured to generate a calibration serial data stream with a period that is four times longer than the period of serial data stream 610, and multiplexers 617 and 618 may be configured to pass the generated calibration serial data stream on to Grey code oscillators 620.

Calibration enable signal 611 may be enabled/disabled upon detecting a preamble or training portion of serial data stream 610 and/or a start of packet portion of serial data stream 610. Calibration signal generator 615, as shown in FIG. 6, may be configured simply to pass a training portion of serial data stream 610 (e.g., corresponding to calibration enable signal 611 being low). In some embodiments, calibration signal generator 615 may be configured to provide at least a single clock width that is to occur after calibration enable signal 611 is disabled but before the start of a payload portion of serial data stream 610.

In other embodiments, other calibration signal generators configured to generate other calibration serial data streams may be included in clock and data recovery deserializer 600. In general, such calibration serial data streams may be characterized by a calibration period corresponding to a whole number multiple of a clock period of the raw serial data stream (e.g., of a training portion of serial data stream 610). Corresponding calibration time periods/binary counts (e.g., stored in storage registers 644) may be approximately half the full calibration period. In various embodiments, calibration signal generators 612 and 615 may be configured to detect a training portion in a preamble of serial data stream 610 and/or generate one or more calibration serial data streams based, at least in part, on the training portion of serial data stream 610.

Asynchronous oversampling Grey code oscillators 620 may include one or more Grey code oscillators (e.g., low Grey code oscillator 621 and high Grey code oscillator 622) configured to measure time periods (e.g., calibration, payload, high, low, and/or other time periods) between signal transitions in a serial data stream (e.g., in a calibration or raw serial data stream, and/or in a training portion or a payload portion of a serial data stream) provided to or generated by various elements of clock and data recovery deserializer 600. Each Grey code oscillator 621 and 622 may be configured to increment a Grey code count between signal transitions in a serial data stream, and as such, each Grey code oscillator should be implemented so as to increment its Grey code count multiple times during a half period of a clock cycle of (raw) serial data stream 610, so as to provide sufficient resolution to recover the corresponding clock and/or data signals.

In particular, low Grey code oscillator 621 may be configured to increment a first Grey code count from zero between negative and adjacent positive signal transitions in serial data stream 610 and/or a corresponding calibration serial data stream (e.g., a low portion of such streams), and Grey code oscillator 622 may be configured to increment a second Grey code count, asynchronously relative to the first Grey code count, from zero between positive and adjacent negative signal transitions in serial data stream 610 and/or a corresponding calibration serial data stream (e.g., a high portion of such streams). The timing of start, stop, and reset of each of Grey code oscillators 621 and 622 may be controlled by sample timing circuitry 623, 625, and/or 625, for example, along with appropriate signal transitions in serial data stream 610 and/or a corresponding calibration serial data stream (e.g., provided by multiplexers 616 and 617 to respective Grey code oscillators 621 and 622).

In various embodiments, sample timing circuitry 623, 625, and/or 625 may advantageously include elements coupled between Grey code oscillators 620 (e.g., Grey code oscillator 621 and Grey code oscillator 622), Grey code converters 640 and 642, and/or storage registers 644, so as to facilitate proper timing between operation of the various elements without incurring race conditions or other timing issues. For example, as can be seen in FIG. 6, AND gate 623 requires Grey code oscillator 622 reach a minimum Grey code count (e.g., a pattern of outputs c1 and b1) before resetting Grey code oscillator 621 (e.g., by providing a high signal to input f of Grey code oscillator 621), and AND gate 624 requires Grey code oscillator 621 reach a minimum Grey code count before resetting Grey code oscillator 622. Also, traces 625 require a Grey code count of Grey code oscillator 621 reach a minimum Grey code count before high calibration time periods measured by Grey code oscillator 622 are stored in storage registers 644, and require a Grey code count of Grey code oscillator 622 reach a minimum Grey code count before low calibration time periods measured by Grey code oscillator 621 are stored in storage registers 644, as shown. In some embodiments, the minimum Grey code counts initiating resets and storage may be identical. Grey code oscillators 621 and 622 may be configured to start incrementing their respective Grey code counts based on signal transitions in signals provided to inputs e of Grey code oscillators 621 and 622 (e.g., calibration/serial data streams provided by multiplexers 616 and 617).

Grey code converters 640 and 642 may be configured to convert Grey code counts provided by Grey code oscillators 620 into a different format, such as binary counts, as shown. Such binary counts may represent a high or low time period measured by Grey code oscillators 620. For example, Grey code converters 640 and 642 may be configured to convert Grey code counts provided by respective low/high Grey code oscillators 621/622 to corresponding low/high binary counts. In particular, Grey code converter 640 may be configured to convert a Grey code count provided approximately at a positive signal transition in a signal provided to input e of Grey code oscillator 621 to a low binary count corresponding to a low time period (e.g., a calibration, training, and/or payload time period) between a negative and an adjacent positive signal transition in the signal provided to input e of Grey code oscillator 621. Similarly, Grey code converter 642 may be configured to convert a Grey code count provided approximately at a negative signal transition in a signal provided to input e of Grey code oscillator 622 to a high binary count corresponding to a high time period between a positive and an adjacent negative signal transition in the signal provided to input e of Grey code oscillator 622. Such low and high binary counts may correspond to low and high calibration and/or payload binary counts, for example.

In the embodiment presented by FIG. 6, each Grey code converters 640/642 includes respective Grey to binary blocks 650/655 coupled to their respective Grey code oscillators and binary counters 651/656 coupled to the most significant bit outputs d0/d1 of their respective Grey code oscillators. As shown in FIG. 6, outputs d0 and d1 of Grey code oscillators 621 and 622 correspond to the base frequency (e.g., lowest frequency) outputs of Grey code oscillators 621 and 622, and as such, transitions in those outputs can be counted by a conventional binary counter without risk of generating a race condition or other timing issue at the inputs of storage registers 644 and/or various clock/data recovery circuitry further along the signal propagation paths in clock and data recovery deserializer 600. Moreover, binary counters 651/656 allow Grey code oscillators 621/622 to measure time periods greater than the maximum Grey code count achievable by Grey code oscillators 621/622, by incrementing as each Grey code oscillator passes through its maximum Grey code count. Grey code converters 640/642 each concatenate the most significant bits of the binary count (e.g., the slowest changing bits) provided by binary counters 651/656 with the least significant bits of the binary count (e.g., the fastest changing bits) provided by Grey to binary blocks 650/655 and then provide the resulting binary counts to storage registers 644.

In general, storage registers 644 may be configured to store data representative of time periods (e.g., calibration time periods, training time periods, payload time periods, and/or other time periods) measured by Grey code oscillators 620, and provide the stored time periods to clock recovery circuit 660 and/or data recovery circuit 670 (e.g., to comparators and/or other circuit elements within circuits 660 and/or 670). More particularly, storage registers 644 may be configured to store high and low binary counts (e.g., calibration binary counts, and/or other binary counts) corresponding to high and low time periods measured by Grey code oscillators 620.

For example, as shown in FIG. 6, storage registers 652 and 657 may be configured to store respective low and high calibration binary counts corresponding to low and high time periods of a calibration signal generated by calibration signal generator 615 (e.g., CAL1), and storage registers 653 and 658 may be configured to store respective low and high calibration binary counts corresponding to low and high time periods of a calibration signal generated by calibration signal generator 612 (e.g., CAL4). In various embodiments, storage registers 644 may include additional or a different number of storage registers 652, 653, 657, 658, and/or a different selection of latching logic (e.g., the AND gates linked to their respective storage registers in storage registers 644), for example, to store additional and/or different binary counts corresponding to additional or different time periods, such as those associated with additional or different calibration serial data streams, payload portions of a serial data stream, and/or others. Moreover, such latching logic may be configured to latch storage registers 644 according to a different selection of sample times (e.g., as dictated, at least in part, by sample timing circuitry/traces 625 and/or serial data stream 610, as shown).

Additionally as shown in FIG. 6, in some embodiments, storage registers 644 may be configured to perform various operations on the binary counts as they are stored and/or as they are provided to other elements of clock and data recovery deserializer 600. In particular, storage registers 653 and 658 may be configured to divide a binary count provided to those registers by 4 (e.g., using a bit shift operation) so as to store and/or provide a binary count that is an average low or high time period corresponding to a single high or low time period of a training portion/clock signal of serial data stream 610, for example, averaged over four consecutive low or high time periods of the training portion/clock signal of serial data stream 610. In some embodiments, the CAL4 calibration time periods with be stored in storage registers 644 at the end of each training portion of serial data stream 610. Logic at the output of storage registers 644 may be configured to provide initial delay binary counts to determine a center of a beginning pulse in serial data stream 610.

As also shown in FIG. 6, clock and data recovery deserializer 600 may include output multiplexers 646 configured to provide high/low calibration time periods/binary counts and/or high/low payload time periods/binary counts to clock recovery circuit 660 and/or data recovery circuit 670, for example, which may be controlled by the instant high/low state of serial data stream 610. Once calibration signal generators 612 and 615 are disabled, the values in storage registers 646 are stable, and only the non-calibration time period output N (e.g., which may be a payload time period output) is updated as serial data stream 610 is processed by clock and data recovery deserializer 600.

Clock recovery circuit 660 may include at least one comparator (e.g., comparator 665) and be configured to receive at least one calibration binary count (e.g., high or low, from storage registers 644) and binary counts (e.g., from storage registers 644 and/or directly from Grey code converters 640 and/or 642, which may be payload binary counts) and generate recovered clock signal 682 corresponding to serial data stream 610. For example, as shown in FIG. 6, recovered clock signal 682 may be based, at least in part, on a change in the output state of comparator 665. In some embodiments, comparator 665 may be configured to compare measured payload time periods (e.g., signals N provided to input A of comparator 665) to a calibration time period (e.g., which may be a base calibration time period) and initiate a recovered clock signal transition when a measured payload time period exceeds the calibration time period.

To recover a base clock corresponding to serial data stream 610 (e.g., the highest frequency for signal transitions in serial data stream 610, typically presented in a training portion of serial data stream 610), clock recovery circuit 660 may include multiplexer 662, latch 663, and integrator 664 configured to determine a high/low base calibration time periods (e.g., corresponding to a high/low base clock time periods) and provide the base calibration time periods to comparator 665. As shown in the embodiment presented by FIG. 6, clock recovery circuit 660 may include additional logic (e.g., latches 661 and 666, and register 668) to help stabilize recovered clock signal 682 (e.g., with respect to calibration time periods stored in latches 652 and 653, or in latches 657 and 658) and/or to generate a double data rate version of recovered clock signal 682. A shown, latch 663 may be reset substantially at signal transitions in serial data stream 610 as detected by reset generator 618.

In FIG. 6, data recovery circuit 670 is configured to receive recovered clock signal 682 (e.g., as provided by latch 666) and serial data stream 610 (e.g., which may be propagated through a known delay as shown) and generate recovered data signal 680 corresponding to serial data stream 610, which may be based, at least in part, on recovered clock signal 682 and serial data stream 610, as shown. In particular, data recovery circuit 670 may include register 672 configured to receive serial data stream 610 and periodically provide stored portions of serial data stream 610 as recovered data signal 680, as dictated by signal transitions in recovered clock signal 682. In some embodiments, such arrangement may be used to sample the center of each bit cell of serial data stream 610.

More generally, data recovery circuit 670 may be configured to generate recovered data signal 680 corresponding to a payload portion of serial data stream 610 by, at least in part, relying on the comparison of measured payload time periods (e.g., measured/provided by Grey code oscillators 620) to one or more calibration time periods, which, as shown in FIG. 6, may be performed by clock recovery circuitry 660. For example, data recovery circuit 670 may be configured to generate recovered data signal 680 by sampling a payload portion of serial data stream 610 at recovered clock signal transitions in recovered clock signal 682. Other embodiments of clock and data recovery deserializer 600 may omit clock recovery circuit 660 and instead use one or more comparators implemented within data recovery circuit 670 to generate data recovery signal 680, as described herein. Optionally, clock and data recovery deserializer 600 may include a decoder configured to convert recovered data signal 680 to a differently encoded or formatted data signal, including converting 8b10b encoded data back into eight bit encoded data and/or parallel data signals, as described herein.

FIGS. 7-9 illustrate Grey code oscillator implementations for a PLD in accordance with an embodiment of the disclosure. For example, FIG. 7 includes a table 700 illustrating how a Grey code count of a Grey code oscillator (e.g., Grey code oscillators 621 and 622) can be incremented from zero (at the top of table 700) to a maximum Grey code count (e.g., corresponding to a decimal count of 15) for a four bit Grey code oscillator. Notably, at each transition in the incremental count, only one bit changes state. This is particularly advantageous at high count rates because it helps to eliminate risk of race conditions and/or other timing issues associated with multiple bits changing states during a single increment and timing the sampling or counting of such state changes. Moreover, as noted herein, the most significant bit d changes the slowest throughout the increment, though it and bit c effectively have the same frequency as the Grey count is allowed to wrap from 15 back to zero (e.g., from 1000 back to 0000).

FIG. 8 shows an embodiment of Grey code oscillator 621 that can be implemented entirely within a single programmable logic block 104 (e.g., eight locally linked programmable logic cells 200), using two chained 4-LUTs per equation in logic 802. The benefit of implementing such freely oscillating oscillator entirely within a PLB is that each PLB in a PLD may linked relatively closely to each other and require relatively little routing resources 180 to, for example, chain individual 4-LUTs in adjacent PLCs, which allows Grey code oscillator 621 to oscillate or increment at approximately the maximum propagation speed supported by the underlying PLD, thereby maximizing the performance of Grey code oscillator 621 and increasing the performance of clock and data recovery deserializer 600 and the maximum recoverable serial data stream frequency/bit rate/data rate. Similarly, FIG. 9 shows an embodiment of Grey code oscillator 622 that can be implemented entirely within a single programmable logic block 104 (e.g., eight locally linked programmable logic cells 200), using two chained 4-LUTs per equation in logic 902, and it's implementation benefits from similar advantages in terms of performance and efficient use of PLD resources.

In general, Grey code oscillators 621 and 622 may be implemented as ripple style Grey code oscillators with operating frequencies a minimum of approximately five times an expected maximum data rate of serial data stream 610. The exact frequencies for either or both Grey code oscillators 621 and 622 do not need to be set, accurate, or known, because each oscillator will be effectively synchronized to serial data stream 610. Moreover, stability of their respective frequencies, either to themselves or to each other, is generally not required because the frequencies may be re-synchronized for every serial data stream packet. For example, Grey code oscillators 621 and 622 may be synchronized with transitions between low and high levels of serial data stream 610 during a training portion of serial data stream 610. The training portion can be as short as 4 data cells including an alternating one-zero sequence, but is typically approximately 50 data cell in length.

Figures 10, 11:
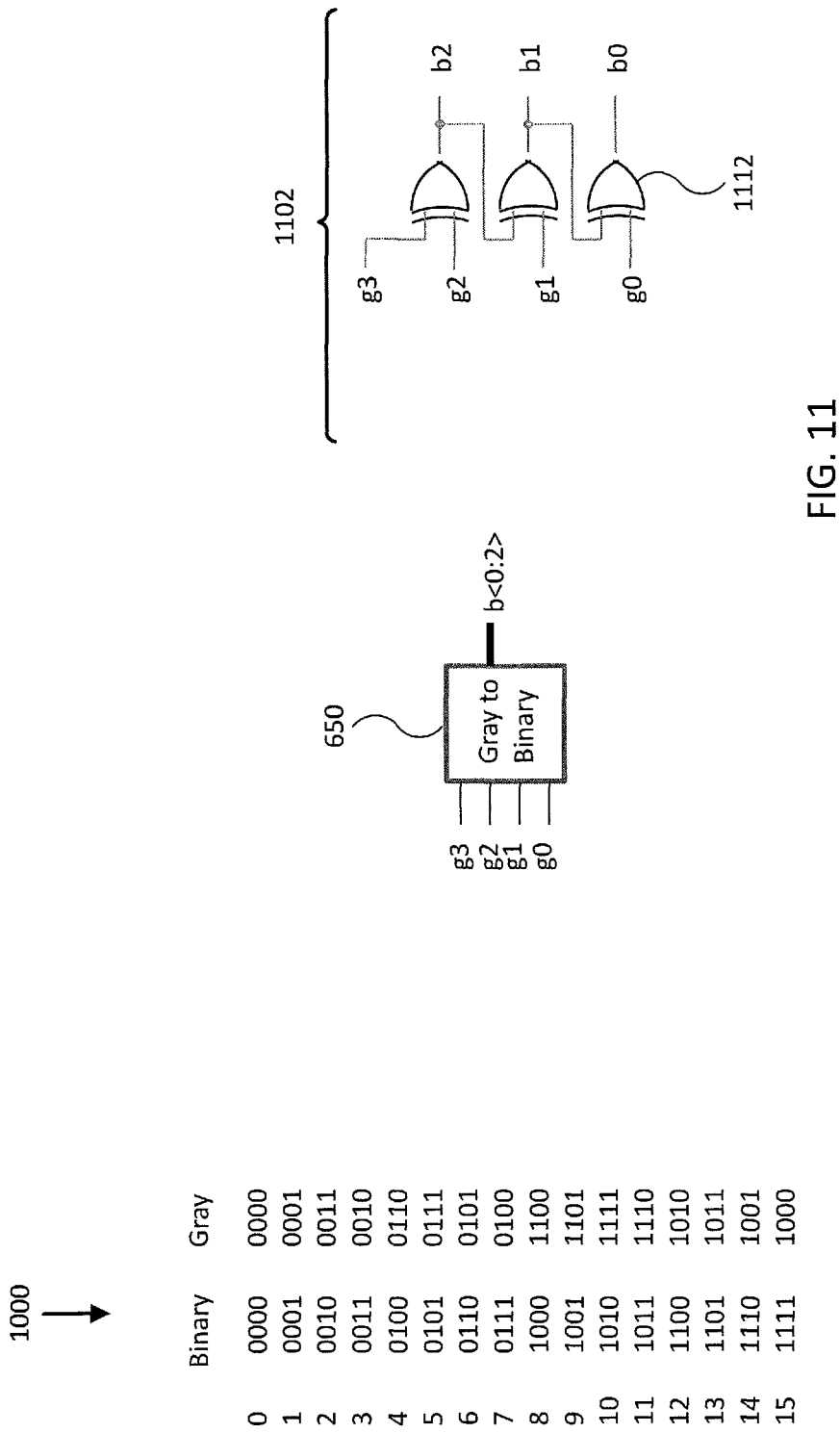
FIGS. 10-11 illustrate a Grey to binary converter implementation for a PLD in accordance with an embodiment of the disclosure.
Figure 12:
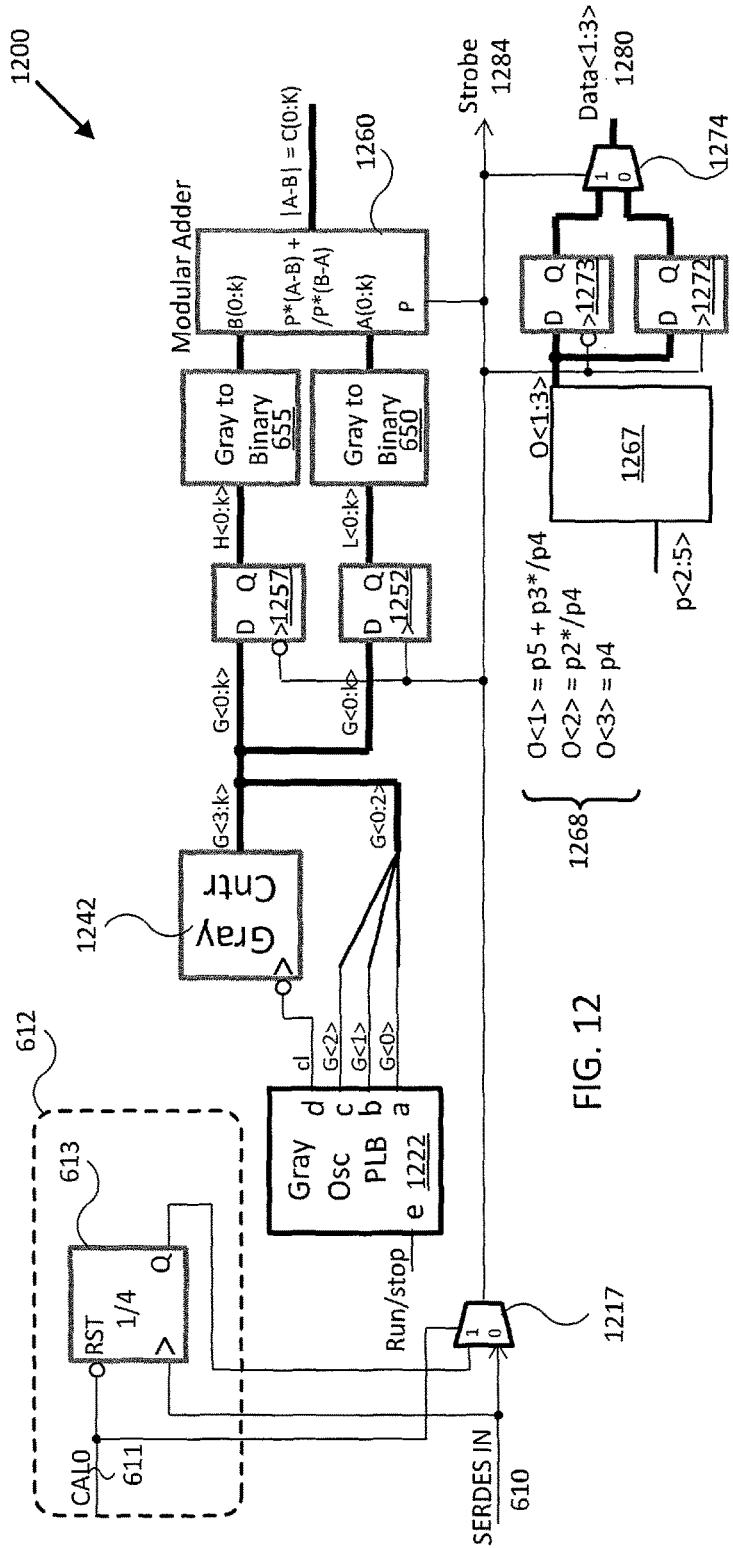
FIGS. 12-15 illustrate block diagrams of circuitry implementing a data recovery deserializer for a PLD in accordance with an embodiment of the disclosure.
Figure 14:
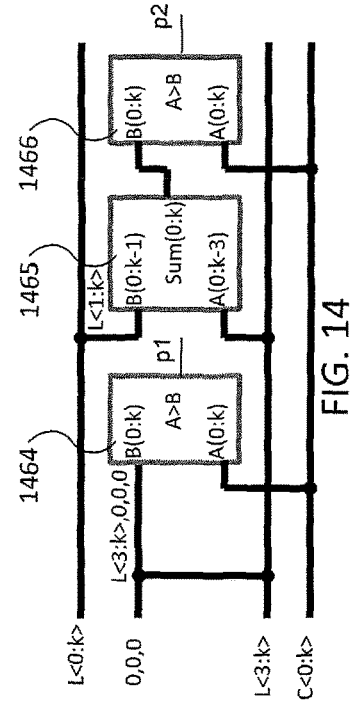
Figure 13:
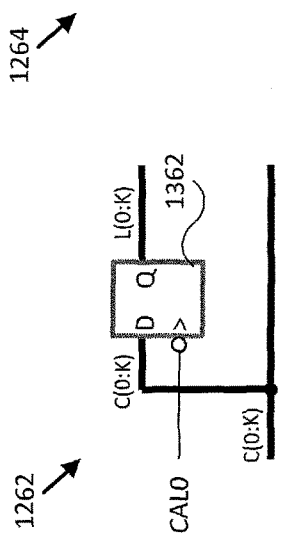
Figure 15:
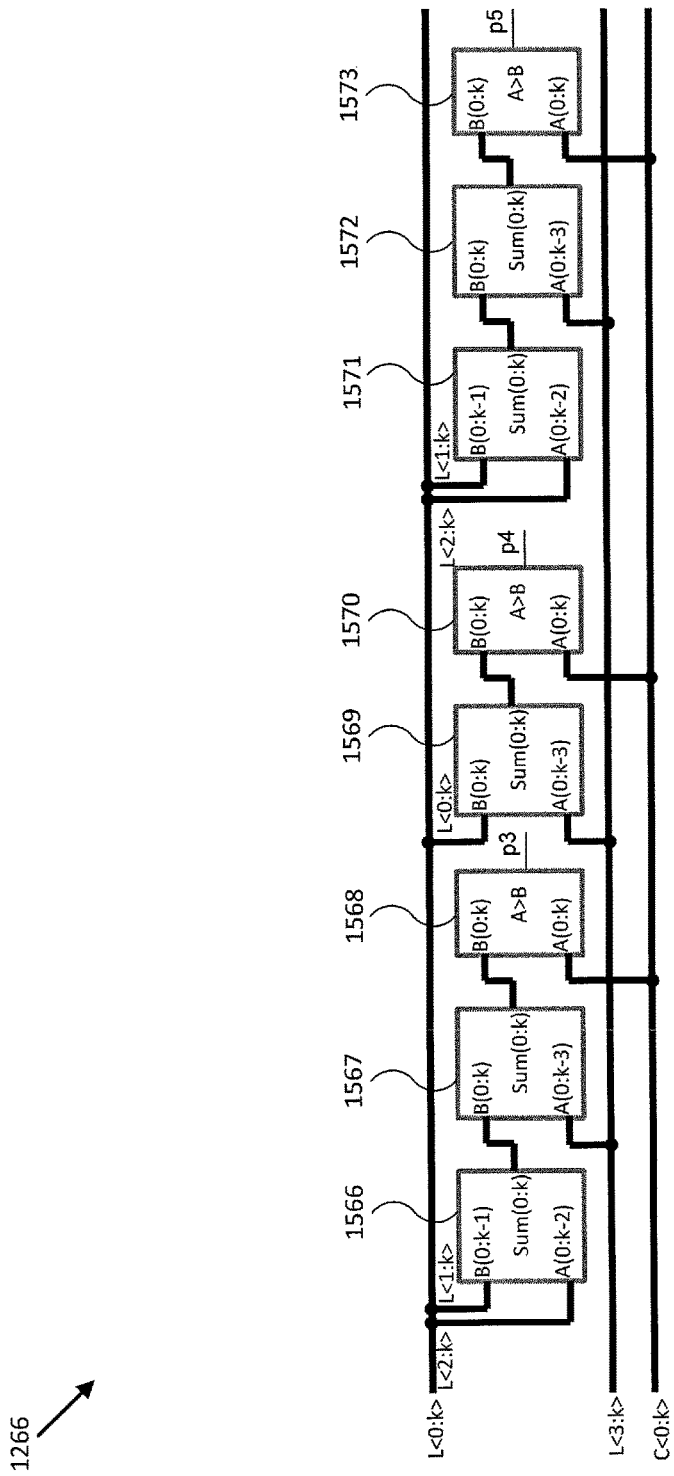

FIGS. 10-11 illustrate a Grey to binary converter implementation for a PLD in accordance with an embodiment of the disclosure. For example, FIG. 10 includes a table 1000 illustrating how a Grey code count provided by a Grey code oscillator (e.g., Grey code oscillators 621 and 622) can be converted to a binary count for a four bit Grey code oscillator. FIG. 11 shows an embodiment of Grey to binary block 650 that can be implemented according to a limited number of logic elements 1102, which may include three cross linked XOR logic gates as shown. For example, logic 1102 may be implemented by three chained 4-LUTs (e.g., corresponding to three linked PLCs), which may be implemented entirely within a PLB of a PLD, with benefits similar to those discussed with reference to Grey code oscillator implementations described in FIGS. 7-9.

Embodiments of clock and data recovery deserializer 600 may be used to recover clock and/or data from serial data streams from 10-50 Mbps, for example, and/or approaching serial data streams of 100 Mbps. Such rates are achievable by PLD fabrics capable of supporting signals transiting a chain of six LUTs at approximately 10 MHz rates or better, for example. As understood by one in the art, such rates are significantly dependent upon the process and techniques used to fabricate the underlying PLD fabric, for example, or upon processes and techniques used to fabricate an underlying IC (e.g., in embodiments where clock and data recovery deserializer 600 is implemented in RTL logic). Embodiments provide benefits over conventional techniques, regardless of the underlying PLD or RTL logic fabric, in terms of relative performance per cost, power usage, and/or space utilization.

FIGS. 12-15 illustrate block diagrams of circuitry implementing a data recovery deserializer 1200 for a PLD in accordance with an embodiment of the disclosure. In particular, data recovery deserializer 1200 generally differs from clock and data recovery deserializer 600 of FIG. 6 in that it uses a single freely running Grey code oscillator to measure both high and low time periods of serial data streams (e.g., a calibration serial data stream generated by calibration signal generator 612 and/or serial data stream 610), and it omits clock recovery circuit 660 and instead relies on multiple comparators embedded within data recovery circuit 1264 of FIG. 14 and 1266 of FIG. 15, along with additional logic, to generate recovered data signal 1280. Similar to clock and data recovery deserializer 600 of FIG. 6, data recovery deserializer 1200 may be implemented entirely with generally configurable resources of a PLD. In general, data recovery deserializer 1200 is configured to receive serial data stream/input 610, measure time periods between signal transitions corresponding to serial data stream 610 using Grey code oscillator 1222, and generate recovered data signal/output 1280.

As shown in FIGS. 12-15, data recovery deserializer 1200 includes calibration signal generator 612, oversampling Grey code oscillator 1222, Grey code counter 1242, low/high Grey count storage registers 1252 and 1257, Grey code converters 650 and 655 (e.g., Grey to binary blocks 650 and 655), time period logic block 1260, storage register 1362, and a data recovery circuit including data recovery circuit portions 1264, 1266, logic block 1267, registers 1272 and 1273, and multiplexer 1274. In general operation, data recovery deserializer 1200 initiates Grey code oscillator 1222 incrementing its Grey code count either before or during a training portion of serial data stream 610, and calibration enable signal 611 is driven high to provide a calibration serial data stream from multiplexer 1217 corresponding to the training portion of serial data stream 610.

During this phase of operation, signal transitions in the calibration serial data stream are used to store corresponding low and high Grey code counts in respective registers 1252 and 1257, which are then provided to respective Grey to binary blocks 650 and 655 in order to convert the Grey code counts to corresponding binary counts. Time period logic block 1260 determines the difference between the low and high binary counts in order to determine a corresponding calibration time period/binary count between adjacent transitions in the calibration serial data stream, and the calibration time period/binary count is stored in storage register 1362. The calibration time period/binary count is then provided to various comparators 1464, 1466, 1568, 1570, and, 1573, and integrators 1465, 1566, 1567, 1569, 1571, and 1572, within data recovery circuit portions 1264 and 1266.

Once the calibration phase is over, signal transitions in a payload portion of serial data stream 610 are used to store corresponding low and high Grey code counts in respective registers 1252 and 1257, which are then provided to respective Grey to binary blocks 650 and 655 in order to convert the Grey code counts to corresponding binary counts. Time period logic block 1260 determines the difference between the low and high binary counts in order to determine a corresponding payload time period/binary count between adjacent transitions in the payload portion of serial data stream 610, and the payload time period/binary count is provided to the various comparators and integrators in data recovery circuit portions 1264 and 1266, as shown.

In the embodiment shown in FIGS. 12-15, the various comparators and integrators in recovery circuit portions 1264 and 1266 are configured to detect one of five possible data patterns (e.g., either high or low) expected in the payload portion of serial data stream 610 by changing an output state of the comparator when a compared payload time period/binary count exceeds a corresponding calibration time period/binary count and/or data pattern time period/binary count. Such data patterns may be chosen to generally correspond to any payload time period/binary count measured by Grey code oscillator 1222 and provided in binary form by time period logic block 1260. As shown in logic 1268 for logic block 1267, the state of comparator output p1 may be inferred based on the remaining comparator outputs p2, p3, p4, and p5. Logic block 1267 then provides the detected data pattern in storage register 1272 or 1273, depending on the corresponding low or high state of serial data stream 610, and the data patterns are concatenated and/or output by multiplexer 1274 as recovered data signal 1280. As such, recovered data signal 1280 may be based, at least in part, on a change in an output state of at least one of the comparators in recovery circuit portions 1264 and 1266. In some embodiments, recovered data signal 1280 may be provided to a decoder to convert recovered data signal 1280 to a desired encoding or data signal format, as described herein.

In the embodiment shown in FIGS. 12-15, Grey code counter 1242 is implemented as a logic block configured to count high to low transitions in the most significant bit output of Grey code oscillator 1222 using Grey code. This implementation is used to help eliminate race conditions and/or other timing issues (e.g., at registers 1252 and 1257) that might otherwise be caused by incremental counting using a binary code.

While data recovery circuit portions 1264, 1266, logic block 1267, registers 1272 and 1273, and multiplexer 1274 are configured to detect specific data patterns in the payload portion of serial data stream 610, in other embodiments, data recovery deserializer 1200 may instead be implemented with alternative data recovery circuit elements configured to detect other data patterns and/or another number of data patterns, for example. In some embodiments, data recovery deserializer 1200 may be implemented with a clock recovery circuit and data recovery circuit similar to those presented in FIG. 6. In other embodiments, data recovery deserializer 1200 may be implemented with two Grey code oscillators, similar in arrangement to those presented in FIG. 6, and be configured with separate data recovery circuit portions configured to detect data patterns corresponding to low and high payload binary counts separately from each other. Such embodiments benefit from the race condition elimination benefits and/or other timing issue benefits described with reference to the two Grey code oscillator circuitry and associated sample timing circuitry described with reference to FIG. 6.

Figure 16:
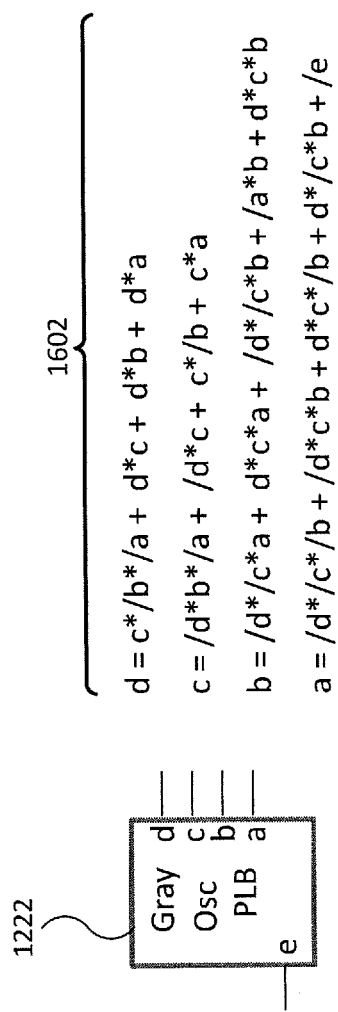
FIG. 16 illustrates a Grey Oscillator implementation for a PLD in accordance with an embodiment of the disclosure.

FIG. 16 illustrates a Grey Oscillator implementation for a PLD in accordance with an embodiment of the disclosure. In particular, FIG. 16 shows an embodiment of Grey code oscillator 1222 that can be implemented entirely within half a single programmable logic block 104 (e.g., four locally linked programmable logic cells 200), using one 4-LUT per equation in logic 1602. The benefit of implementing such freely oscillating oscillator entirely within a PLB is that each PLB in a PLD may linked relatively closely to each other and require relatively little routing resources 180 to, for example, chain individual 4-LUTs in adjacent PLCs, which allows Grey code oscillator 1222 to oscillate or increment at approximately the maximum propagation speed supported by the underlying PLD, thereby maximizing the performance of Grey code oscillator 1222 and increasing the performance of data recovery deserializer 1200 and the maximum recoverable serial data stream frequency/bit rate/data rate. Moreover, such implementation provided for relatively efficient use of PLD resources.

Figure 17:
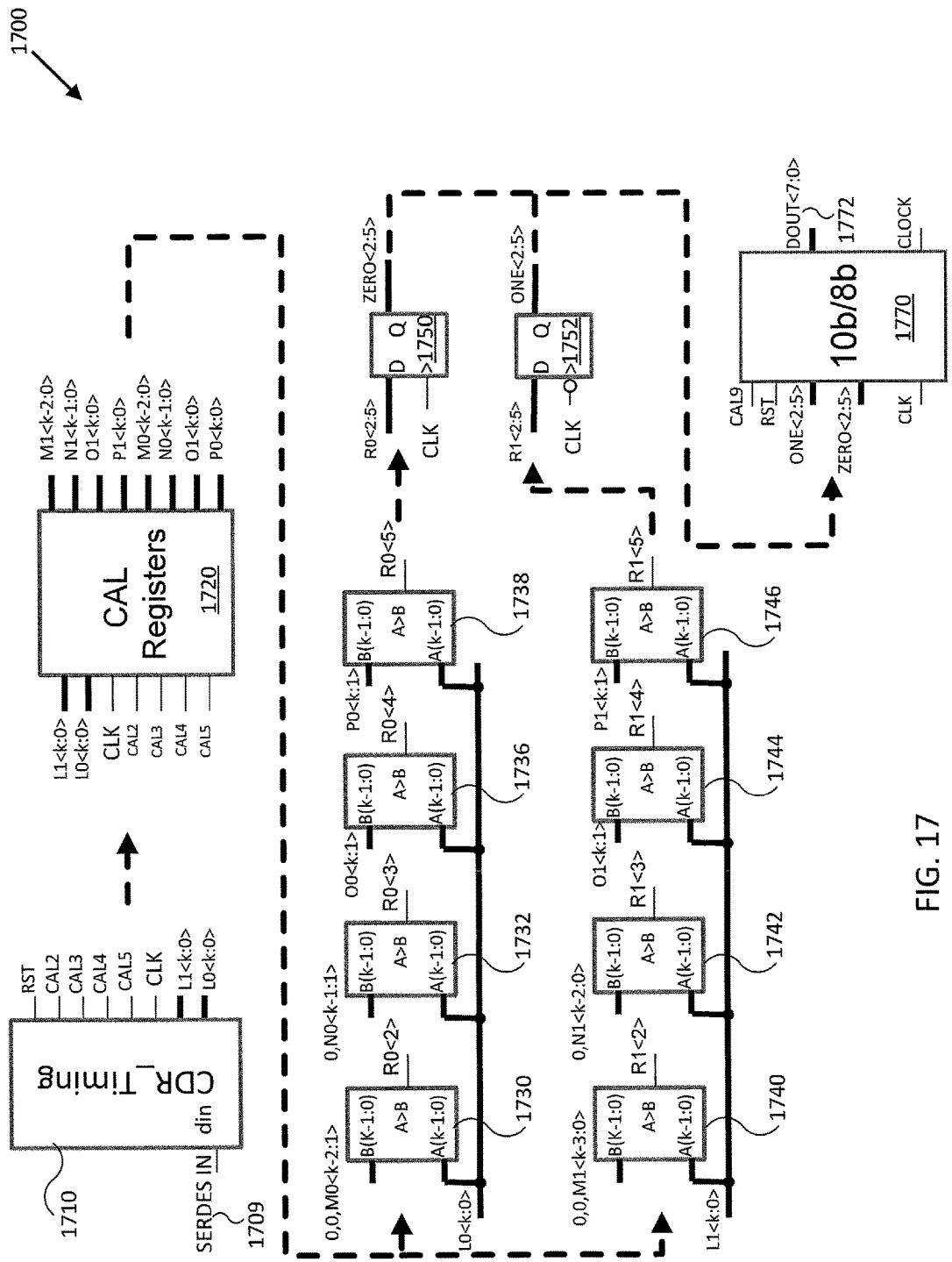
FIG. 17 illustrates a block diagram of a clock and/or data recovery deserializer for a PLD in accordance with an embodiment of the disclosure.

FIG. 17 illustrates a block diagram of a clock and/or data recovery deserializer 1700 for a PLD in accordance with an embodiment of the disclosure. In particular, clock and/or data recovery deserializer 1700 generally differs from clock and data recovery deserializer 600 of FIG. 6 and data recovery deserializer 1200 of FIG. 12 in that its functionality is relatively pipelined, it omits clock recovery circuit 660, it uses two separate series of comparators 1730-1738 and 1740-1746 to generate separate high and low portions of a recovered data signal (e.g., output by registers 1750 and 1752), and it includes a decoder 1770 configured to decode an encoded form of the recovered data signal (e.g., an 8b10b encoded recovered data signal) by converting the encoded recovered data signal into a parallel eight bit recovered data signal. Similar to deserializers 600 and 1200, clock and/or data recovery deserializer 1700 may be implemented entirely with generally configurable resources of a PLD.

In general, clock and/or data recovery deserializer 1700 is configured to receive serial data stream/input 1709 at timing circuit 1710, generate calibration and payload time periods at timing circuit 1710, store the calibration time periods within calibration circuit 1720, compare pairs of adjacent low and high payload time periods to various calibration time periods and/or data patterns at comparators 1730-1738 and 1740-1746, store a corresponding encoded recovered data signal in registers 1750 and 1752, and decode the encoded recovered data signal to provide decoded recovered data signal 1772 at an output of decoder 1770.

As shown in FIG. 17, clock and/or data recovery deserializer 1700 includes timing circuit 1710, calibration circuit 1720, comparators 1730-1738 and 1740-1746, low/high storage registers 1750 and 1752, and optional decoder 1770. In general operation, timing circuit 1710 receives serial data stream 1709, detects a training portion of serial data stream 1709 (e.g., or assumes the beginning of serial data stream 1709 is the training portion), enters a calibration phase of operation (e.g., by driving one or more corresponding calibration enable signals high), measures one or more calibration time periods (e.g., low and high calibration time periods for one or more different length calibration serial data stream periods, such as signal periods corresponding to 2, 3, 4, and 5 data cells of serial data stream 1709), and provides the measured calibration time periods (e.g., in the form of binary counts) to calibration circuit 1720 for storage in a number of corresponding storage registers. Calibration circuit 1720 receives and stores the calibration time periods and may be configured to combine the various calibration time periods according to expected data patterns in payload time periods of a payload portion of serial data stream 1790 and provide various calibration time periods and/or data pattern time periods to comparators 1730-1738 and 1740-1746.

Timing circuit 1710 may then detect a start of packet portion of serial data stream 1709 (or, in some embodiments, simply exit the calibration phase of operation when the calibration phase completes by measuring/determining all the desired calibration/data pattern time periods), exit the calibration phase of operation (e.g., by driving various calibration enable signals low), measure pairs of adjacent low and high payload time periods (e.g., low and high payload time periods for a payload portion of serial data stream 1709), and provide the adjacent measured payload time periods (e.g., in the form of binary counts) to comparators 1730-1738 and 1740-1746, as shown. Comparators 1730-1738 and 1740-1746 may be configured to compare the measured payload time periods to the calibration/data pattern time periods provided by calibration circuit 1720 and store the resulting respective low and high portions of the recovered data signal in respective registers 1750 and 1752. Optionally, decoder 1770 may then receive the low and high portions of an encoded recovered data signal, decode the encoded recovered data signal into a desired recovered data signal encoding and/or format. In some embodiments, decoder 1770 may be configured to detect a beginning of a payload portion of serial data stream 1709 (e.g., a comma encoded within serial data stream 1709 at the beginning of the payload portion) and only begin to provide decoded recovered data signal 1772 after the beginning of the payload portion is detected. In a particular embodiment, decoder 1770 may be configured to decode an 8b10b encoded recovered data signal into eight bit parallel format recovered data signal 1772, as shown. In various embodiments, decoder 1770 and/or other elements of clock and/or data recovery deserializer 1700 may be configured to generate a recovered clock signal based, at least in part, on serial data stream 1709 and/or one or more calibration time periods measured by timing circuit 1710.

In a specific embodiment, where serial data stream 1709 is an 8b10b encoded serial data stream, comparators 1730-1738 may be configured to generate a low portion of a recovered encoded data signal by, at least in part, detecting when a low payload time period measured by timing circuit 1709 is roughly equivalent to two, three, four, or five data cell time periods (a low payload time period roughly equivalent to one data cell time period is inferred by all the outputs of comparators 1730-1738 being zero), where larger low payload time periods are not generated by the expected encoding of serial data stream 1709. Similarly, in such specific embodiment, comparators 1740-1748 may be configured to generate a high portion of a recovered encoded data signal by, at least in part, detecting when a high payload time period measured by timing circuit 1709 is roughly equivalent to two, three, four, or five data cell time periods (a high payload time period roughly equivalent to one data cell time period is inferred by all the outputs of comparators 1740-1748 being zero), where larger high payload time periods are not generated by the expected encoding of serial data stream 1709.

More generally, in other embodiments, clock and/or data recovery deserializer 1700 may include a different number of comparators 1730-1738 and/or 1740-1748, calibration circuit 1720 may generate different combinations of calibration time periods and/or according to different expected data patterns, and/or timing circuit 1710 may measure and generate different calibration time periods, for example, according to a known encoding of serial data stream 1709. Moreover, in other embodiments, serial data stream 1719 may be encoded according to a variety of different encoding schemes, such as a pulse width modulation encoding, a phase modulation encoding, a pulse width phase modulation encoding, other bit depth encodings, and/or variable bit depth encodings, for example, and elements of clock and/or data recovery deserializer 1700, including decoder 1770, may be modified to recover and/or decode a data signal from such serial data stream using an embodiment of Grey code oscillator(s) 621, 622, and/or 1222 to measure time periods and/or other signal characteristics associated with the data transmitted by the serial data stream.

Figure 18:
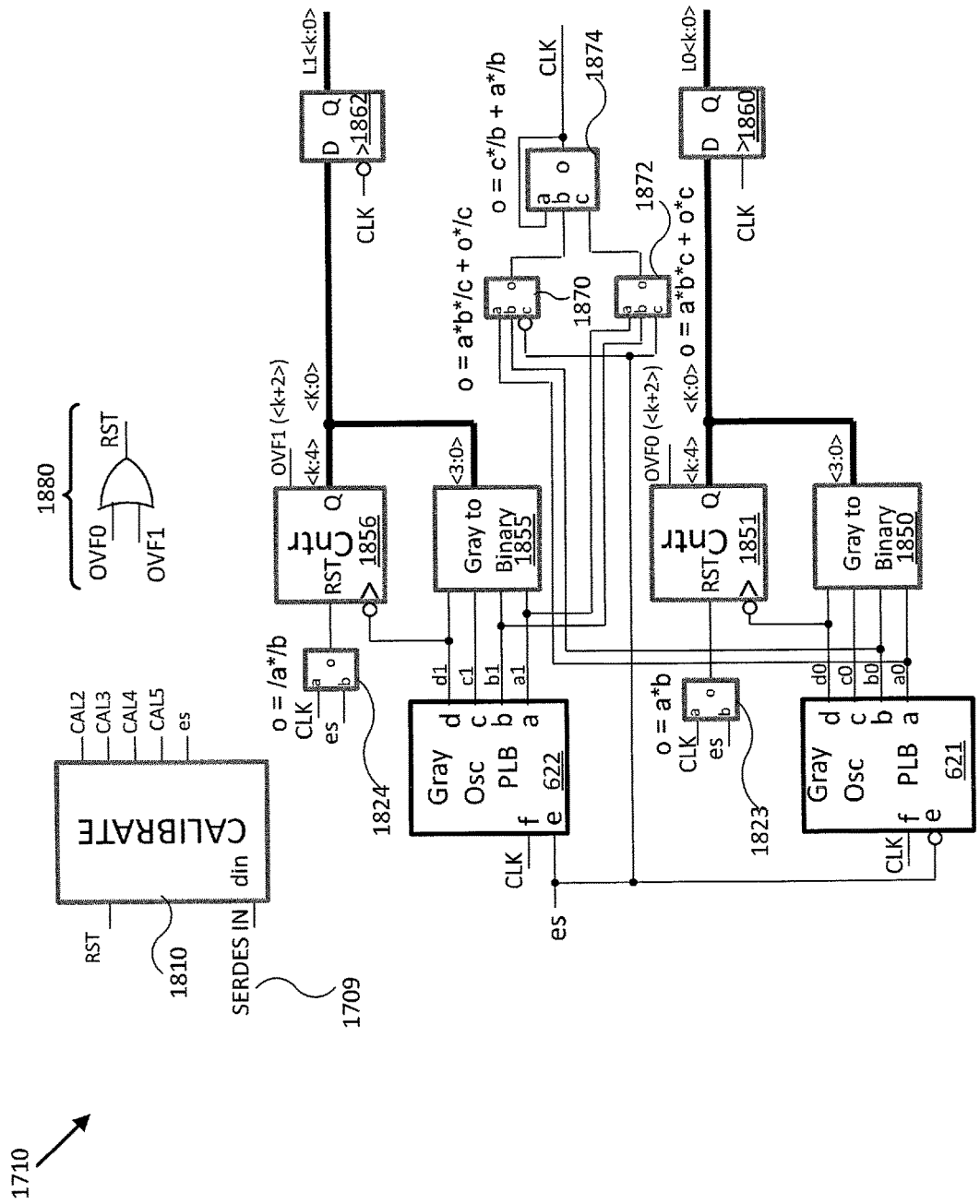
FIG. 18 illustrates a block diagram of a timing circuit for a clock and/or data recovery deserializer in accordance with an embodiment of the disclosure.

FIG. 18 illustrates a block diagram of timing circuit 1710 for clock and/or data recovery deserializer 1700 in accordance with an embodiment of the disclosure. As shown in FIG. 18, timing circuit 1710 includes calibration signal generator 1810, reset generator 1880, low and high Grey code oscillators 621 and 622, a low Grey code converter including Grey to binary block 1850 and binary counter 1851, a high Grey code converter including Grey to binary block 1855 and binary counter 1856, low and high storage registers 1860 and 1862, and sample timing circuitry including logic blocks 1823, 1824, 1870, 1872, and 1874. Calibration signal generator 1810 may be configured to receive serial data stream 1709 and generate various corresponding calibration serial data streams and/or pass through serial data stream 1709 as serial data stream es, as described herein. In general operation, the Grey code oscillators, Grey code converters, and sample timing circuitry of timing circuit 1710 operate similarly to similar elements described with reference to deserializer 600 in FIG. 6.

For example, the sample timing circuitry identified in FIG. 18 (e.g., logic blocks 1870, 1872, 1874, 1823, and/or 1824) may be configured to control the timing of start, stop, and reset of each of Grey code oscillators 621 and 622, for instance, and/or storage of low and high time periods (e.g., in the form of binary counts) in respective low/high storage registers 1860 and 1862, according to internal clock signal CLK (e.g., generated by logic blocks 1870, 1872, and 1874) and serial data stream es generated by calibrate signal generator 1710. Logic blocks 1823 and 1824 may be configured to reset binary counters 1850 and 1856 according to internal clock signal CLK and serial data stream es. Binary counters 1851 and 1856 may each be implemented with an additional output configured to generate an internal reset signal RST when combined according to reset signal generator 1880, as shown. Such internal reset signal RST may be provided to calibration signal generator 1810, as shown.

In various embodiments, the sample timing circuitry identified in FIG. 18 (e.g., logic blocks 1870, 1872, 1874, 1823, and/or 1824) may advantageously include elements coupled between Grey code oscillator 621 and Grey code oscillator 622, Grey code converters (e.g., Grey to binary block 1850 and binary counter 1851, and Grey to binary block 1855 and binary counter 1856), and/or storage registers 1860 and 1862, so as to facilitate proper timing between operation of the various elements without incurring race conditions or other timing issues.

For example, as can be seen in FIG. 18, logic blocks 1870-1874 require Grey code oscillator 622 reach a minimum Grey code count (e.g., a pattern of outputs a1 and b1) before resetting Grey code oscillator 621 (e.g., by providing a high CLK signal to input f of Grey code oscillator 621), and logic blocks 1870-1874 require Grey code oscillator 621 reach a minimum Grey code count before resetting Grey code oscillator 622. Also, logic blocks 1870-1874 require a Grey code count of Grey code oscillator 621 reach a minimum Grey code count before high calibration time periods measured by Grey code oscillator 622 are stored in storage register 1862, and require a Grey code count of Grey code oscillator 622 reach a minimum Grey code count before low calibration time periods measured by Grey code oscillator 621 are stored in storage register 1860, as shown. In some embodiments, the minimum Grey code counts initiating resets and storage may be identical. Grey code oscillators 621 and 622 may be configured to start incrementing their respective Grey code counts based on signal transitions in signals provided to inputs e of Grey code oscillators 621 and 622 (e.g., calibration/serial data streams provided as signal es by calibration signal generator 1810).

Figure 19:
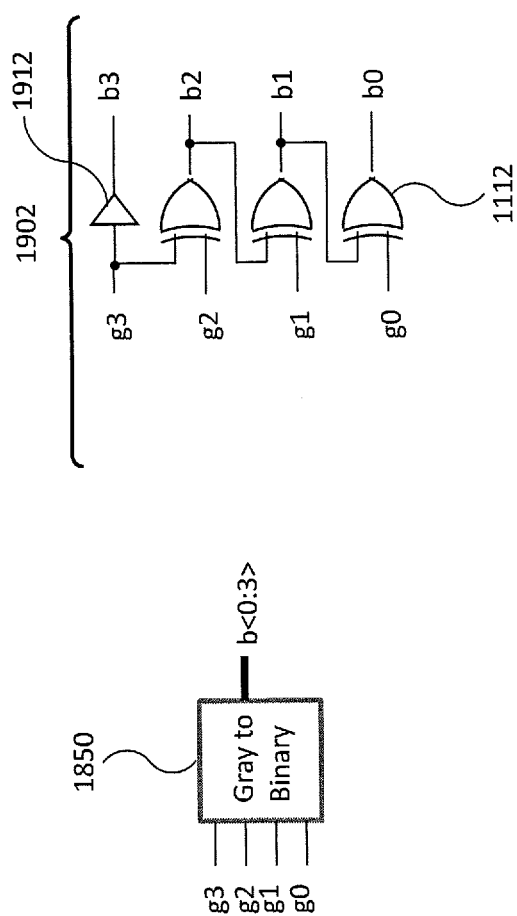
FIG. 19 illustrates a Grey to binary converter for a timing circuit in accordance with an embodiment of the disclosure.

FIG. 19 illustrates a Grey to binary converter (e.g., Gray to binary block 1850) for timing circuit 1710 in accordance with an embodiment of the disclosure. Gray to binary block 1850 operates similarly to Gray to binary block 650 as described with reference to FIGS. 6, 10, and 11, but may be implemented with a different arrangement of logic elements 1902, as shown in FIG. 19, where input g3 is coupled through a delay buffer 1912 to output b3 to help reduce race conditions and/or other timing issues associated with operation of Gray to binary block 1850. FIG. 19 shows an embodiment of Grey to binary block 1850 that can be implemented according to a limited number of logic elements 1902, which may include delay buffer 1912 and three cross linked XOR logic gates as shown. For example, logic 1902 may be implemented by four chained 4-LUTs (e.g., corresponding to four linked PLCs), which may be implemented entirely within a PLB of a PLD, with benefits similar to those discussed with reference to Grey code oscillator implementations described in FIGS. 7-9 and Grey to binary block implementation described in FIGS. 10-11.

Figure 20:
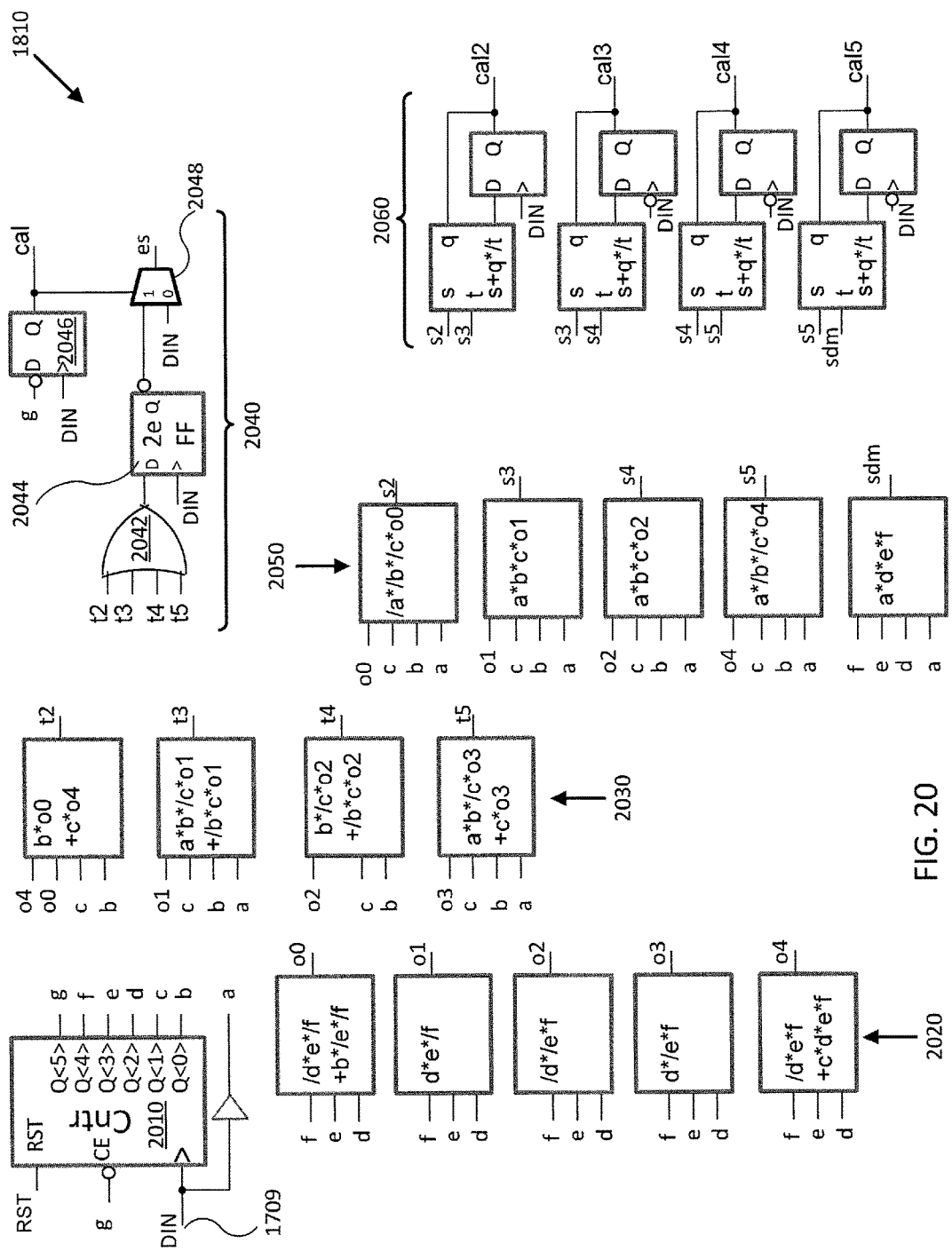
FIG. 20 illustrates a block diagram of a calibration signal generator for a timing circuit in accordance with an embodiment of the disclosure.

FIG. 20 illustrates a block diagram of calibration signal generator 1810 for timing circuit 1710 in accordance with an embodiment of the disclosure. As shown in FIG. 20, calibration signal generator 1810 includes counter 2010 configured to provide serial data stream 1709 (e.g., output a) and/or generate a training signal/calibration count based on serial data stream 1709 (e.g., outputs b-g) to logic blocks 2020, 2030, and 2050, logic blocks 2060 configured to generate various calibration enable signals (e.g., including registers configured to store and provide calibration enable signals CAL2, CAL3, CAL4, and CAL5, corresponding to calibration serial data streams with high and low calibration time periods of 2, 3, 4, and 5 data cell widths), and serial data signal generator 2040 configured to generate corresponding calibration serial data streams and/or pass through serial data stream 1709, as appropriate.

In typical operation, logic blocks 2020 and 2030 may be configured to use the calibration count provided by counter 2010 to generate calibration timing signals t2-t5, which when provided to flip flop 2044 through OR gate 2042 cause flip flop 2044 of serial data signal generator 2040 to generate various calibration serial data streams with different associated time periods at output es of multiplexer 2048 (e.g., which is then forwarded to Grey code oscillators 621 and 622 of timing circuit 1710 in FIG. 18). Multiplexer 2048 is controlled by output g of counter 2010 (e.g., a most significant bit of counter 2010, which may correspond to a count of 32 in a binary counter), as sampled and stored by register 2046 according to serial data stream 1709, which is output as a generic CAL enable signal by serial data signal generator 2040 as shown. Once output g of counter 2010 is driven high, multiplexer 2040 of serial data signal generator 2040 may be configured to pass through serial data stream 1709 at output es, and counter 2010 may be disabled/halted, thereby forcing multiplexer 2040 to pass through serial data stream 1709 at output es until counter 2010 is reset by internal reset signal RST, as shown.

In addition, logic blocks 2050 and 2060 may be configured to use the calibration count provided by counter 2010 and calibration timing signals o0-o4 provided by logic blocks 2020 to generate calibration enable signals CAL2, CAL3, CAL4, and CAL5, corresponding to the instant calibration serial data stream generated by serial data signal generator 2040 while the appropriate calibration enable signal CAL2, CAL3, CAL4, and CAL5 is driven high by logic blocks 2060.

Figure 21:
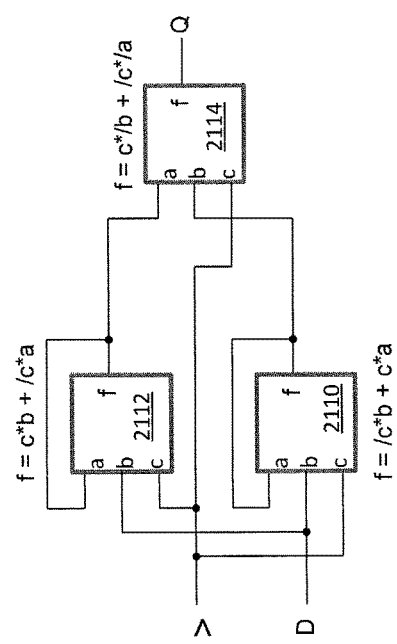
FIG. 21 illustrates a block diagram of a flip flop for a calibration signal generator output in accordance with an embodiment of the disclosure.

FIG. 21 illustrates a block diagram of flip flop 2044 for serial data signal generator 2040 of calibration signal generator 1810 in accordance with an embodiment of the disclosure. As shown in FIG. 21, flip flop 2044 may be implemented with three interconnected logic blocks 2110, 2112, and 2114, as shown, and in some embodiments may be configured to generate an output serial data stream with low and high time periods approximately equal in length to the high time period of a signal provided to input D, as sampled according to the nearest transition of a signal provided to the latch input ">" of flip flop 2044. More generally, flip flop 2044 may be implemented as a dual edge flip flop configured to latch an input at D at rising and falling transitions of the latch input ">" of flip flop 2044. In some embodiments, each logic block 2110, 2112, and 2114 of flip flop 2044 may be implemented by a single LUT/PLC within a PLD.

Figure 22:
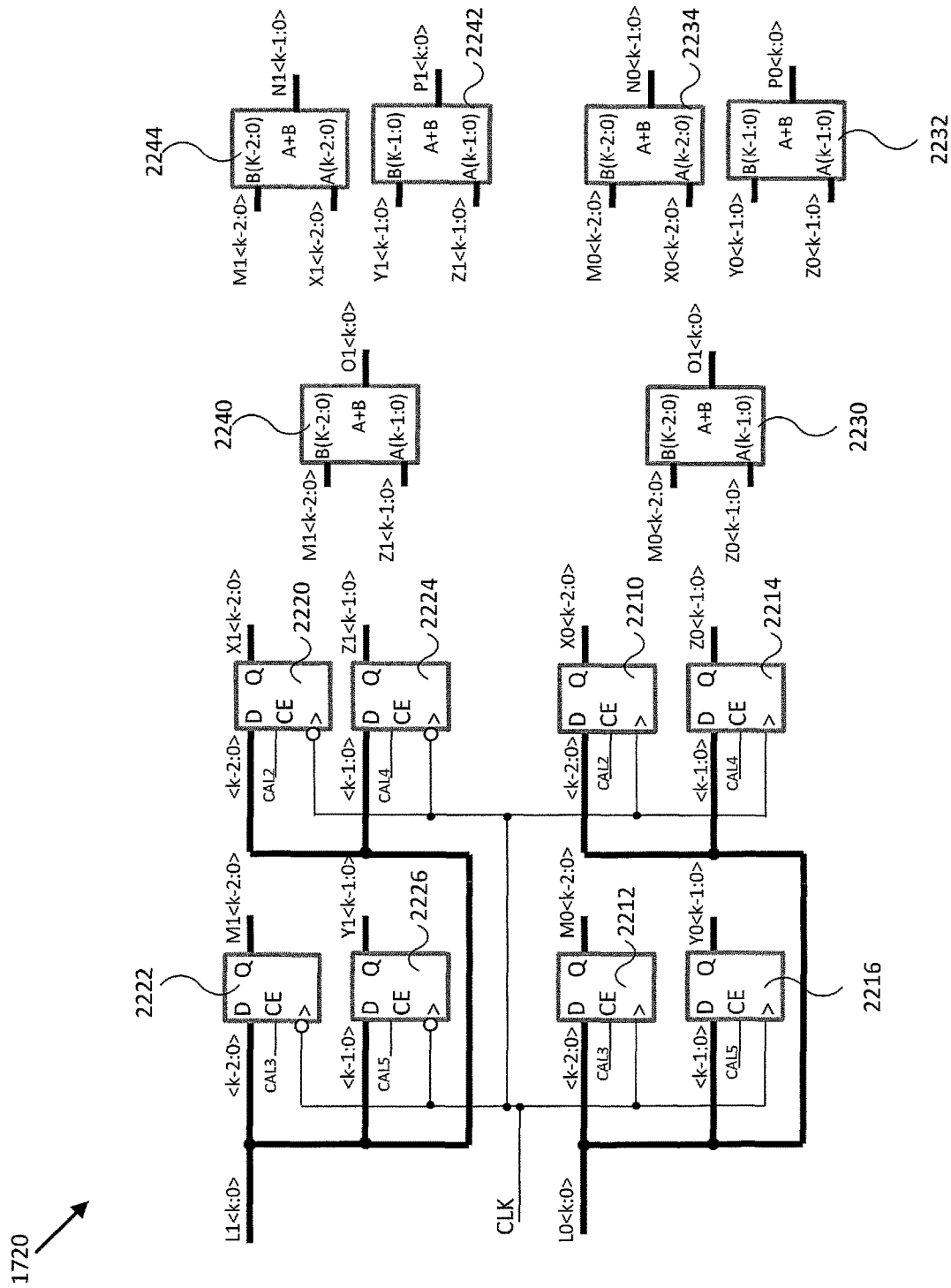
FIG. 22 illustrates a block diagram of a calibration circuit for a clock and/or data recovery deserializer in accordance with an embodiment of the disclosure.

FIG. 22 illustrates a block diagram of calibration circuit 1720 for clock and/or data recovery deserializer 1700 in accordance with an embodiment of the disclosure. As shown in FIG. 22, calibration circuit 1720 may include a number of different storage registers (e.g., low storage registers 2210-2216 and high storage registers 2220-2226) configured to store low/high calibration time periods measured by Grey code oscillators 621 and 622 of timing circuit 1710 (e.g., in the form of corresponding binary counts stored and provided by low/high storage registers 1860 and 1862) as sampled according to internal clock signal CLK (e.g., generated by sample timing circuitry of timing circuit 1710) and various calibration enable signals (e.g., CAL2, CAL3, CAL4, and CAL5). As also shown in FIG. 22, calibration circuit 1720 may also include a number of low and high integrators 2230-2234 and 2240-2244 configured to combine low/high calibration time periods according to various low/high data patterns expected in a payload portion of serial data stream 1709.

In some embodiments, low storage registers 2210-2216, high storage registers 2220-2226, and/or low and high integrators 2230-2234 and 2240-2244 may include additional logic configured to further manipulate low/high calibration time periods to help generate various data pattern time periods configured to help detect particular data patterns within a payload portion of serial data stream 1709 (e.g., utilizing comparators 1730-1738 and 1740-1746 in FIG. 17), such as bit shift logic, dividers, multipliers, and/or other logic and/or arithmetic operations. In the specific embodiment illustrated in FIG. 22, low and high integrators 2230-2234 and 2240-2244 are configured to sum two different calibration time periods and divide the result by 2, so as to provide a data pattern time period configured to differentiate expected payload time periods according to a selection of expected data patterns (e.g., at comparators 1730-1738 and 1740-1746 in FIG. 17). For example, logic block 2230 may be configured to sum calibration time periods corresponding to 3 and 4 data cells, for a total time period corresponding to 7 data cells, then divide the sum by 2 to result in a data pattern time period (e.g., time period differentiator value) corresponding to approximately 3.5 data cells, which can be used (e.g., at comparators 1730-1738 and 1740-1746) to reliably differentiate payload time periods corresponding to approximately 3 data cells from payload time periods corresponding to approximately 4 data cells. In general, calibration circuit 1720 may include a different number and arrangement of storage registers and/or logic blocks 2230-2234 and 2240-2244 according to a different expected encoding of serial data stream 1709, for example, or according to a different comparison scheme to generate a recovered data signal from a payload portion of serial data stream 1709.

Figure 23:
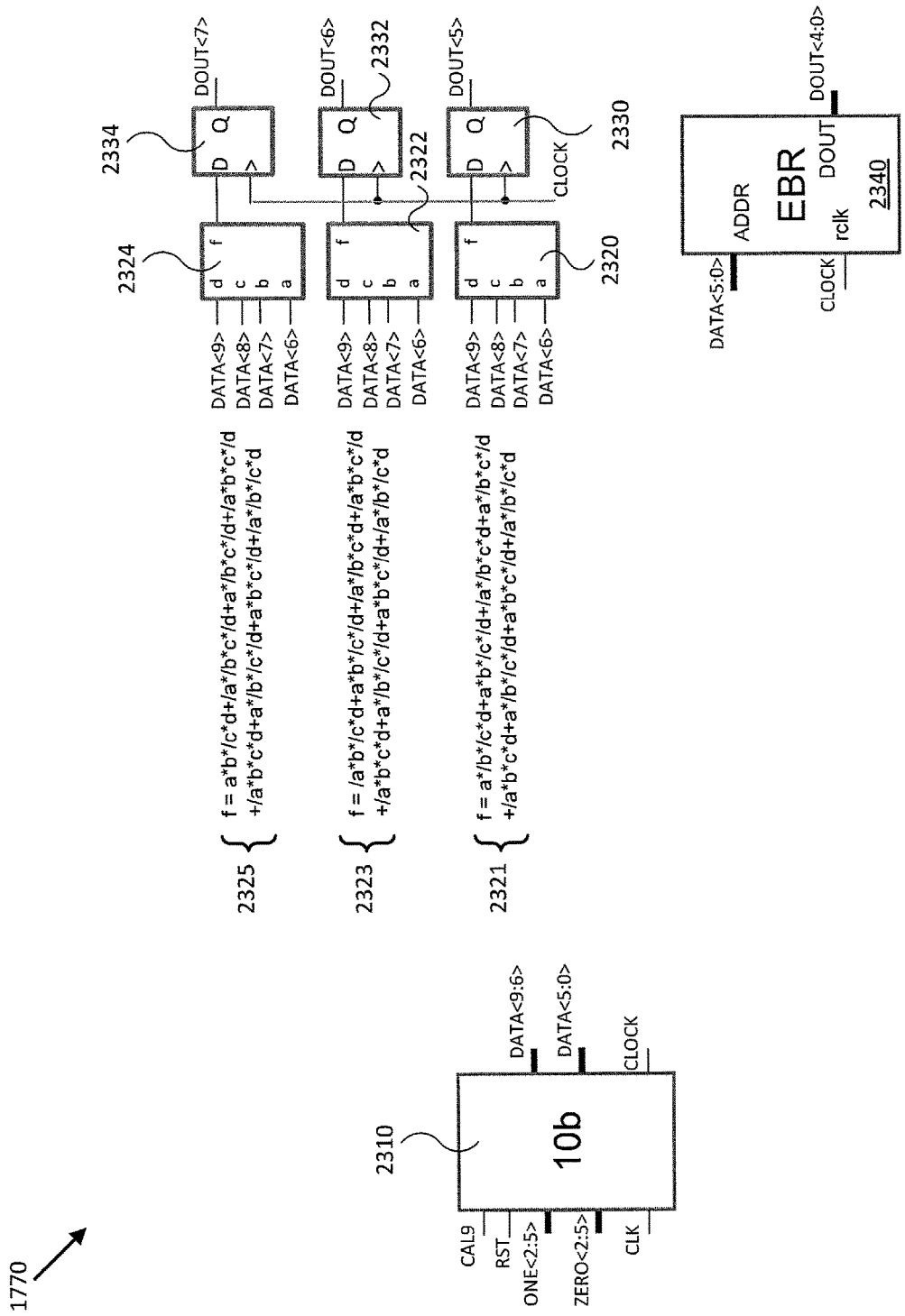
FIG. 23 illustrates a block diagram of a decoder/decoder circuit for a clock and/or data recovery deserializer in accordance with an embodiment of the disclosure.

FIG. 23 illustrates a block diagram of decoder/decoder circuit 1770 for clock and/or data recovery deserializer 1700 in accordance with an embodiment of the disclosure. As shown in FIG. 23, decoder 1770 includes recovered data splitter 2310 configured to receive the encoded recovered data signal stored in registers 1750 and 1752 and generate six bit and four bit split encoded data signals. The four bit split encoded data signal may be provided to logic blocks 2320, 2322, and 2324 (e.g., implemented respectively according to logic 2321, 2323, and 2325), which may be configured to decode the four bit split encoded data signal into the three most significant bits (e.g., bits 5, 6, and 7) of a decoded recovered data signal (e.g., decoded recovered data signal 1772). The six bit split encoded data signal may be provided to block 2340, which may be configured to decode the six bit split encoded data signal into the five least significant bits (e.g., bits 0, 1, 2, 3, and 4) of the decoded recovered data signal generated by decoder 1770. In some embodiments, block 2340 may be implemented using an embedded block RAM of a PLD, for example. Altogether, the elements of decoder 1770 may be configured to decode 8b10b encoded recovered data signal (e.g., reverse an 8b10b encoding, as known in the art) into an eight bit recovered data signal and/or format it as a parallel data signal, as shown.

Figure 24:
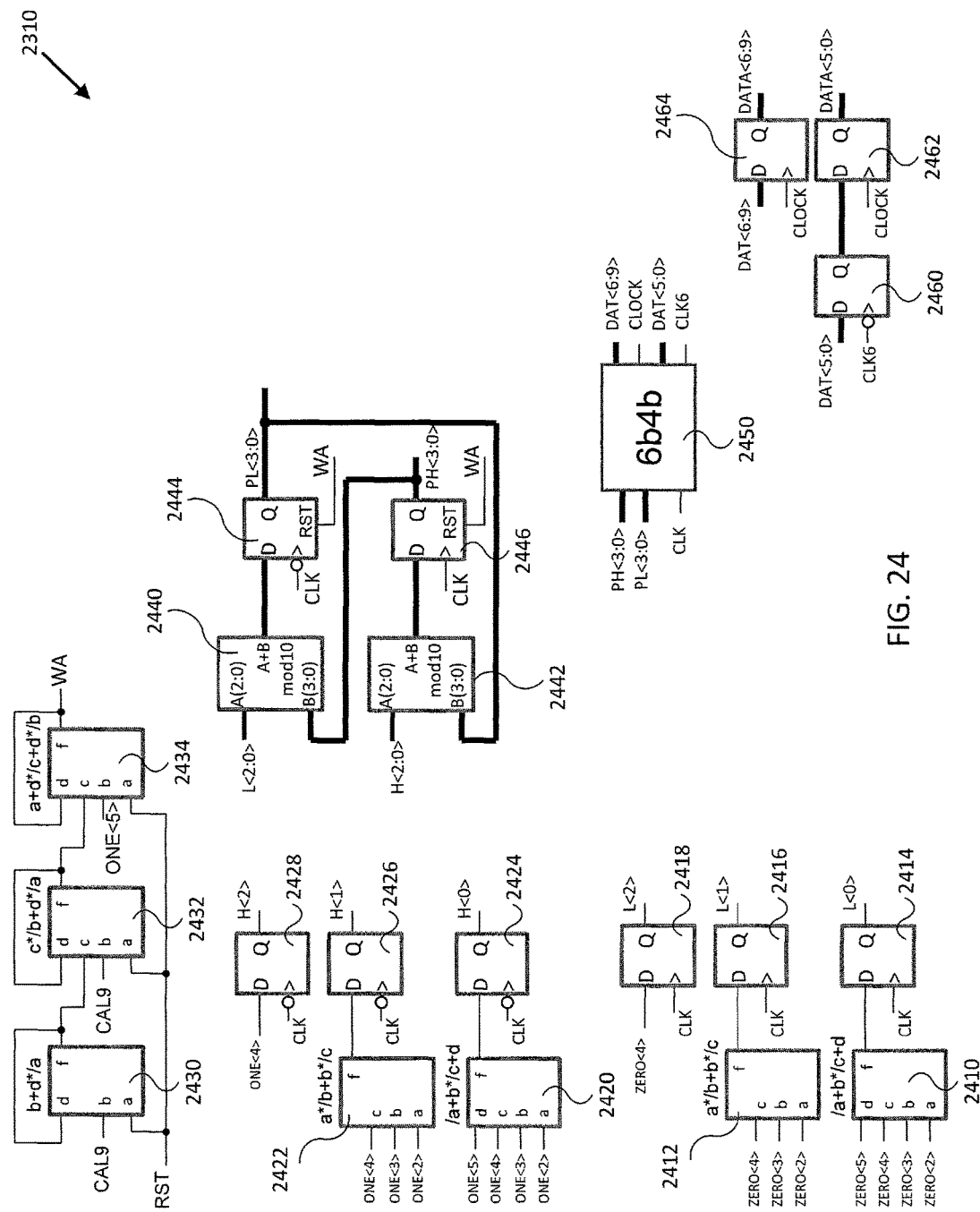
FIG. 24 illustrates a block diagram of a recovered data splitter 2310 for a decoder in accordance with an embodiment of the disclosure.

FIG. 24 illustrates a block diagram of recovered data splitter 2310 for decoder 1770 in accordance with an embodiment of the disclosure. As shown in FIG. 24, recovered data splitter 2310 may include logic blocks 2410-2412 and registers 2414-1418 configured to process and store a low portion of an encoded recovered data signal (e.g., provided by register 1750 in FIG. 17), logic blocks 2420-2422 and registers 2424-1428 configured to process and store a high portion of an encoded recovered data signal (e.g., provided by register 1752 in FIG. 17), logic blocks 2430-2434 configured to generate word alignment signal WA based on signals provided by other elements of deserializer 1700 (e.g., elements of timing circuit 1710, which may generate RST, CLK, and/or CAL9/CAL), logic blocks 2440-2442 and registers 2444-2446 configured to word-align the processed/rearranged low and high portions of the encoded recovered data signal, word-aligned data splitter 2450 configured to split the word aligned low and high portions of the encoded recovered data signal into six bit and four bit split encoded data signals, registers 2460 and 2462 configured to store and forward the six bit split encoded data signal, and register 2464 configured to store and forward the four bit split encoded data signal.

In some embodiments, logic blocks 2430-2434 may be configured to suppress word alignment signal WA during a calibration phase of deserializer 1700 (e.g., as indicated by calibration enable signal CAL9), to detect a beginning of a payload portion of serial data signal 1709, as provided in the recovered data signal provided by registers 1750 and/or 1752), after deserializer 1700 exits the calibration phase (e.g., by driving calibration enable signal CAL9 low), and to trigger word alignment signal WA (e.g., for a first time for a payload portion of serial data signal 1709) upon detecting the beginning of the payload portion so as to set the first word alignment boundary, for example. As shown in FIG. 24, the beginning of a payload portion of serial data signal 1709 may be indicated by a high measured time period, provided to comparators 1740-1746, that is long enough to change a state of recovered data signal bit ONE<5> after the calibration phase is complete (e.g., CAL9 is driven low), and after the training portion of serial data stream 1709 (e.g., during which any measured transition time periods all correspond to a single data cell) is complete.

In various embodiments, logic blocks 2410-2412 and registers 2414-1418 may be configured to convert the low portion of the encoded recovered data signal (e.g., provided by register 1750 in FIG. 17) from a data pattern encoding corresponding to the selection of data patterns detected by comparators 1730-1738 into a relatively compressed encoding (e.g., with a shorter bit width, yet retaining all information embedded within the low portion of the encoded recovered data signal (e.g., ZERO<2:5>). Such relatively compressed or different encoding may be configured to facilitate word alignment of the encoded recovered data signal (e.g., performed by logic blocks 2440-2442 and registers 2444-2446). Similarly, logic blocks 2420-2422 and registers 2424-1428 may be configured to perform a similar conversion to the high portion of the encoded recovered data signal to facilitate word alignment of the high portion of the encoded recovered data signal (e.g., ONE<2:5>).

Figure 25:
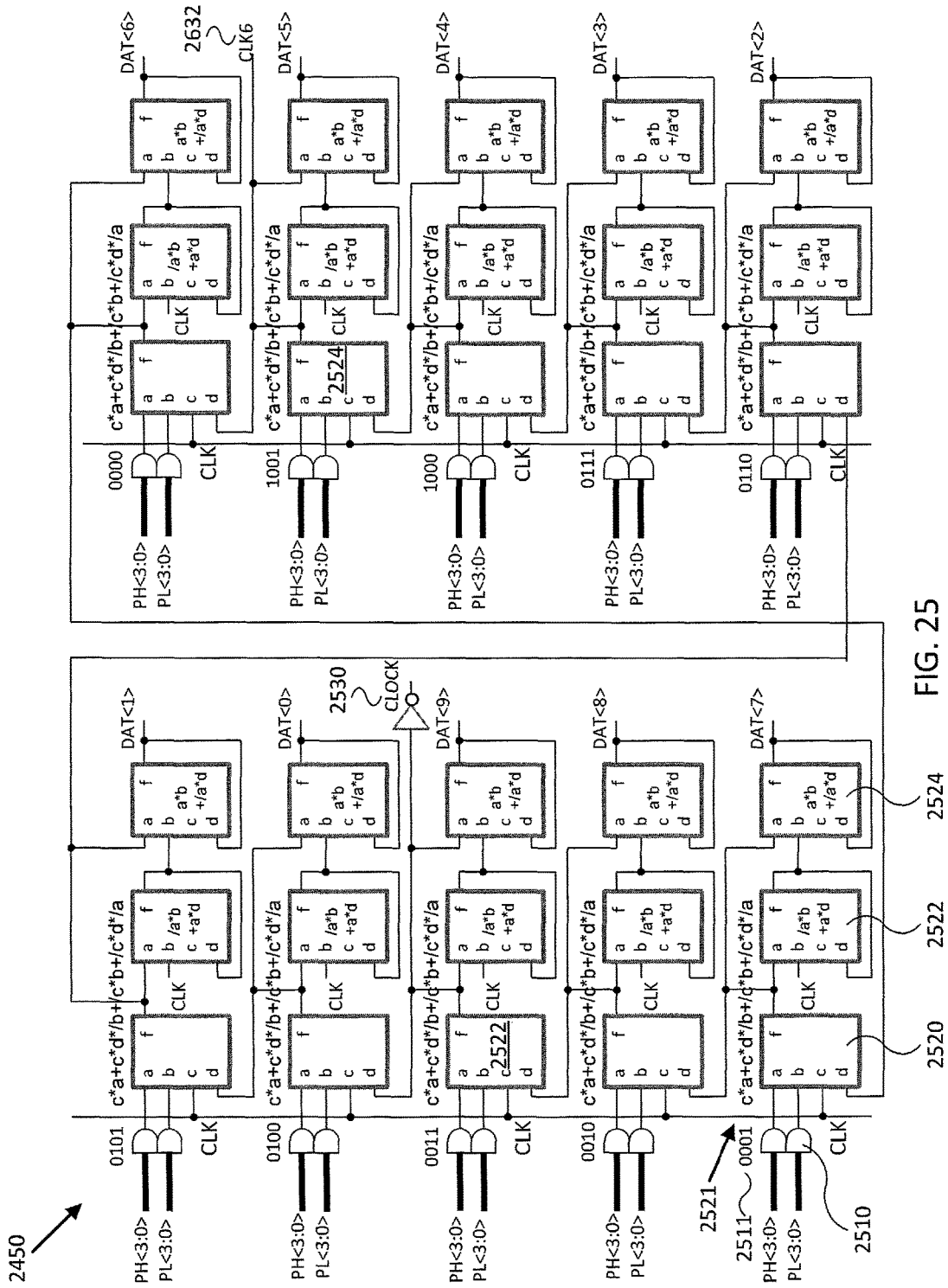
FIG. 25 illustrates a block diagram of a word-aligned data splitter for a recovered data splitter in accordance with an embodiment of the disclosure.

FIG. 25 illustrates a block diagram of word-aligned data splitter 2450 for recovered data splitter 2310 in accordance with an embodiment of the disclosure. As shown in FIG. 25, word-aligned data splitter 2450 may include a number of input selector blocks 2510, each corresponding to a particular bit mask 2511, feeding first layer of logic blocks 2520 (e.g., each implemented according to a corresponding logic equation 2521 for output f), which feeds second and third layers of logic blocks 2522 and 2524 (e.g., implemented according to the indicated logic equations) and cross feeds first layer of logic blocks 2520 as shown. Second layer of logic blocks 2522 feeds third layer of logic blocks 2524, which generates word aligned data signals (DAT<0> through DAT<9>) to be split and output as six bit and four bit split encoded data signals as shown in FIG. 24. Logic block 2522 of first layer of logic blocks 2520 associated with bit mask 0011 may be used to generate internal CLOCK signal 2530, and logic block 2524 of first layer of logic blocks 2520 associated with bit mask 1001 may be used to generate internal CLK6 signal 2532. In various embodiments, internal CLK6 signal 2532 may be used to store the six bit split encoded data signal in register 2460, and internal CLOCK signal 2530 may be used to store and/or forward the six bit split encoded data signal to register 2462 and the four bit split encoded data signal to register 2464, as shown in FIG. 24.

Figure 26:
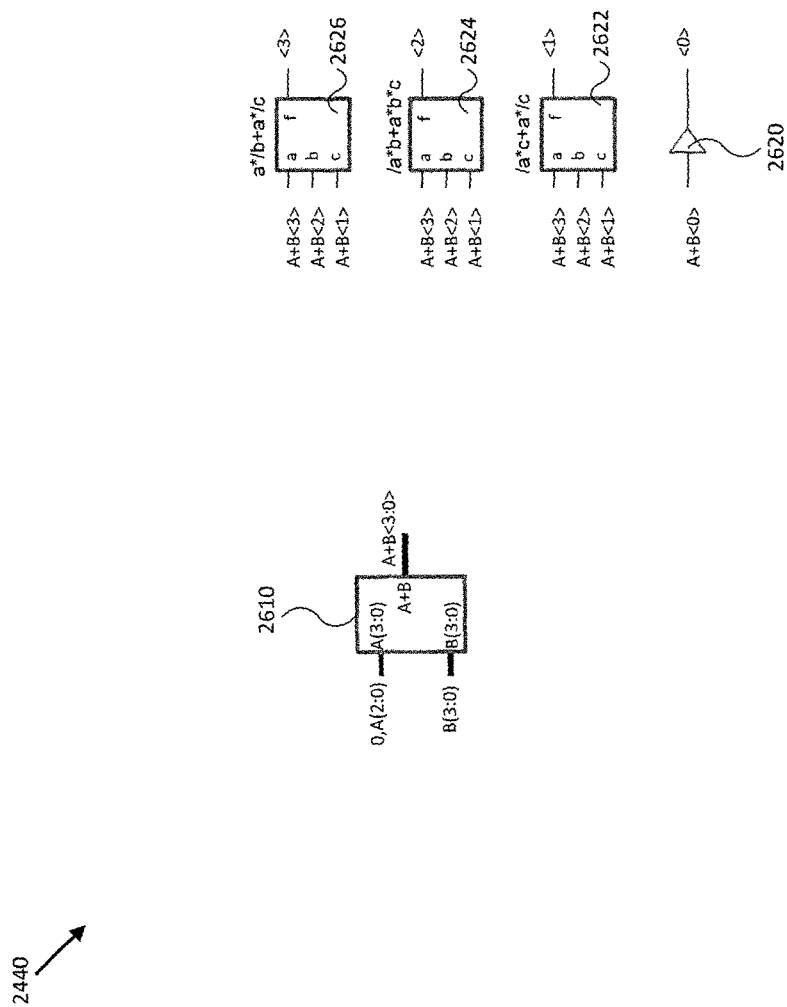
FIG. 26 illustrates a block diagram of a modulo 10 integrator for a recovered data splitter in accordance with an embodiment of the disclosure.

FIG. 26 illustrates a block diagram of a modulo 10 integrator (e.g., logic block 2440) for recovered data splitter 2310 in accordance with an embodiment of the disclosure. As shown in FIG. 26, modulo 10 integrator 2440 may include a logic block 2610 configured to sum two inputs, a buffer 2620 to pass a least significant bit of the sum output by logic block 2610 as the least significant bit of the output of modulo 10 integrator 2440, and three logic blocks 2622-2626 (e.g., implemented according to the indicated logic equations) configured to generate the remaining most significant bits of the output of modulo 10 integrator 2440 each based on the remaining most significant bits of the sum and the indicated logic.

Figure 27:
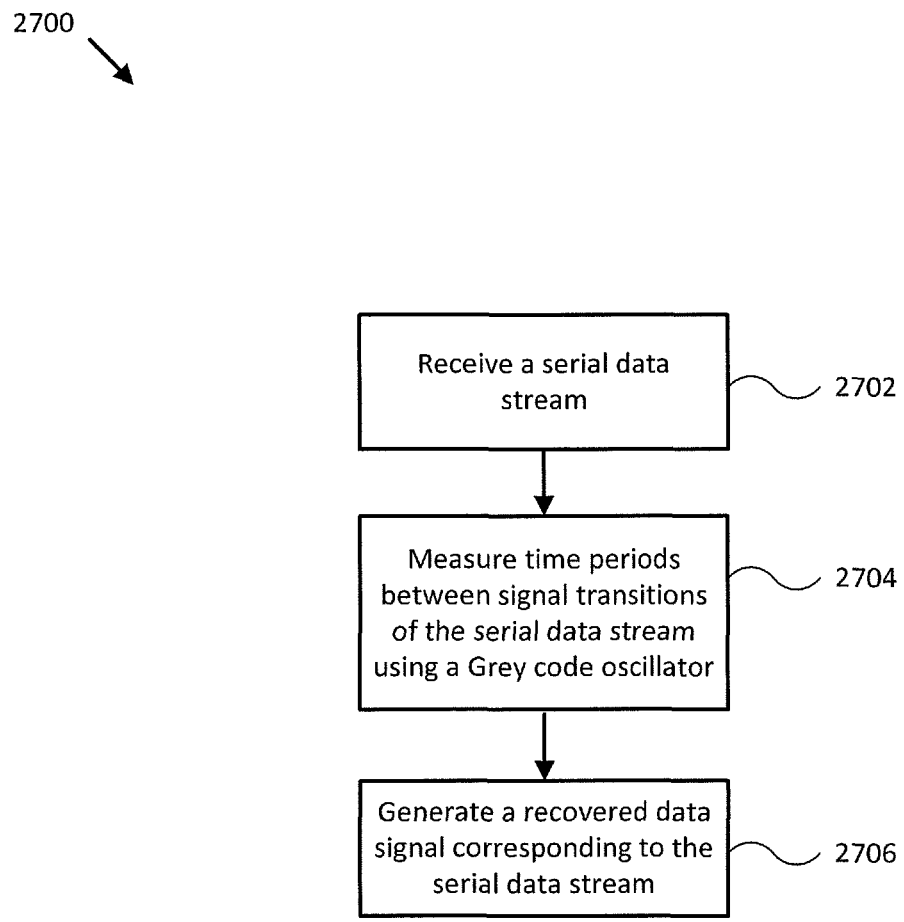
FIG. 27 illustrates a method for operating a clock and/or data recovery deserializer in accordance with an embodiment of the disclosure.

FIG. 27 illustrates a method for operating a clock and/or data recovery deserializer (e.g., deserializers 600, 1200, and/or 1700) in accordance with an embodiment of the disclosure.

In operation 2702, a deserializer receives a serial data stream. For example, deserializers 600, 1200, and/or 1700 may be configured to receive serial data streams 610 and/or 1709. In some embodiments, elements of deserializers 600, 1200, and/or 1700 may be configured to receive calibration serial data streams, for example, that may be generated by corresponding calibration signal generators 612 and/or 1810 based on serial data streams 610 and/or 1709, as described herein.

In operation 2704, a deserializer measures time periods between signal transitions of a serial data stream using a Grey code oscillator. For example, deserializers 600, 1200, and/or 1700 may be configured to measure high and low calibration and/or payload time periods between signal transitions of serial data streams 610 and/or 1709 and/or corresponding calibration serial data streams, as described herein. In some embodiments, the deserializer may be implemented with two Grey code oscillators configured to measure low and high time periods between signal transitions separately by incrementing separate Grey code counts between the signal transitions and converting the Grey code counts approximately at the signal transitions to binary counts each corresponding to a measured low or high time period, as described herein.

In operation 2706, a deserializer generates a recovered data signal corresponding to a serial data stream. For example, deserializers 600, 1200, and/or 1700 may be configured to generate recovered data signals 680, 1280, and/or 1772, as described herein, by comparing payload time periods/binary counts to one or more calibration time periods/binary counts and/or expected data patterns to identify specific corresponding data patterns and/or generate a corresponding recovered data signal. In some embodiments, the recovered data signal may be an encoded recovered data signal, for example, and the deserializer may be implemented with a decoder (e.g., decoder 1770) configured to decode the encoded recovered data signal into a differently encoded and/or formatted recovered data signal. For example, deserializer 1770 may be configured to generate a 10 bit encoded recovered data signal at storage registers 1750 and 1752, and to generate a corresponding eight bit encoded and/or parallel formatted recovered data signal 1772 using decoder 1770.

Figure 28:
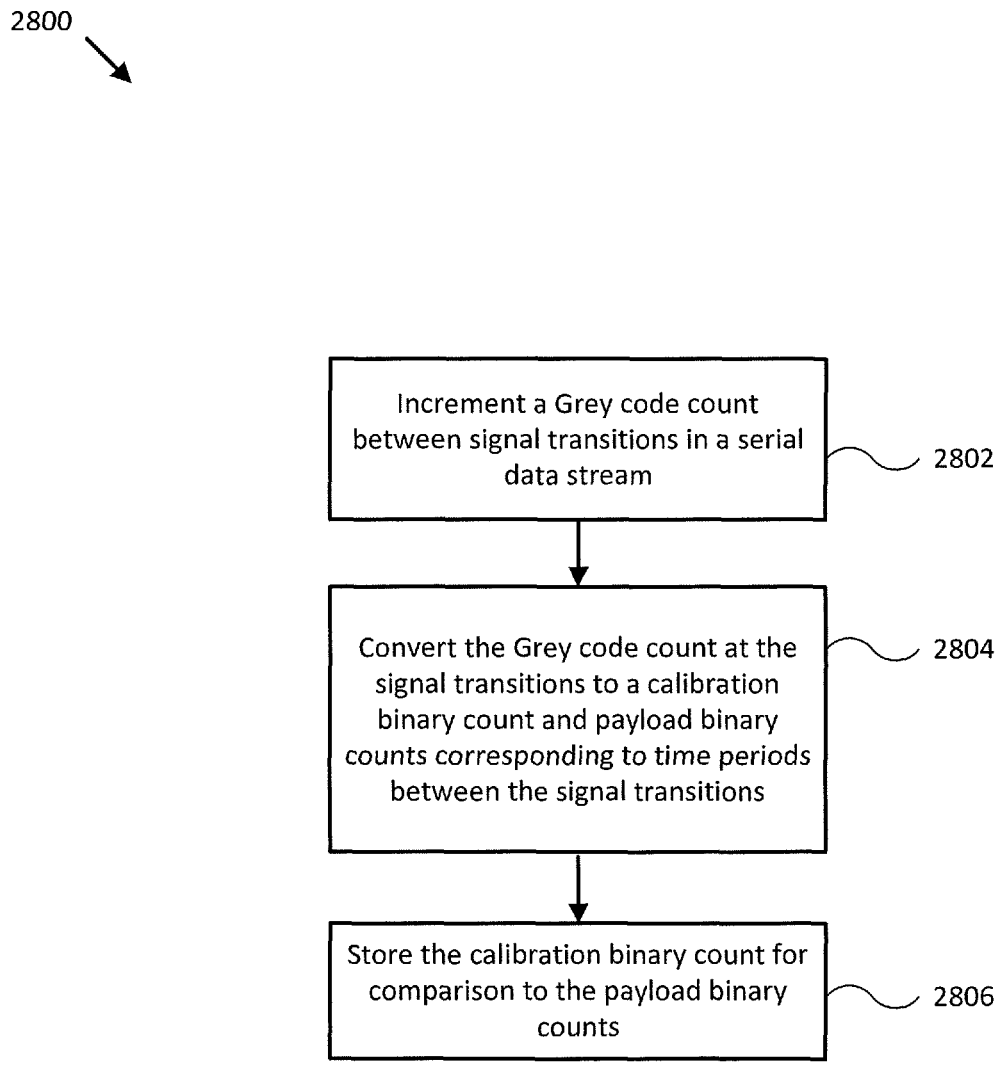
FIG. 28 illustrates a method for operating a clock and/or data recovery deserializer in accordance with an embodiment of the disclosure.

FIG. 28 illustrates a second method for operating a clock and/or data recovery deserializer (e.g., deserializers 600, 1200, and/or 1700) in accordance with an embodiment of the disclosure.

In operation 2802, a deserializer increments a Grey code count between signal transitions in a serial data stream. For example, deserializers 600, 1200, and/or 1700 may be configured to use Grey code oscillators 621, 622, and/or 1222 to increment a Grey code count between signal transition in serial data streams 610 and/or 1709 and/or corresponding calibration serial data streams. In some embodiments, the deserializer may include two Grey code oscillators configured to increment two Grey code counts substantially asynchronously between adjacent negative and positive signal transitions and/or adjacent positive and negative signal transitions.

In operation 2804, a deserializer converts a Grey code count at signal transitions in a serial data stream to a calibration binary count and payload binary counts corresponding to time periods between the signal transitions. For example, deserializers 600, 1200, and/or 1700 may include one or more Grey code converters configured to convert Grey code counts at signal transitions in serial data streams 610 and/or 1709 and/or associated calibration serial data streams to a plurality of binary counts each corresponding to a time period between one or more signal transitions in serial data streams 610 and/or 1709 and/or associated calibration serial data streams. Such plurality of binary counts may include calibration binary counts and/or payload binary counts, for example.

In operation 2806, a deserializer stores a calibration binary count for comparison to payload binary counts. For example, deserializers 600, 1200, and/or 1700 may be configured to store a calibration binary count provided by a Grey code converter in one or more of storage registers 644, 1362, and 2210-2216 and 2220-2226, as described herein. In some embodiments, such calibration binary counts may be stored in various intermediary storage registers, such as storage registers 1860 and/or 1862. Upon storing the calibration binary counts, the various storage registers may be configured to provide or forward the calibration binary counts and/or associated data pattern time periods/binary counts to one or more comparators (e.g., comparators 665, comparators of recovery circuit portions 1264 and 1266, and/or comparators 1730-1738 and 1740-1746) for comparison to payload binary counts and/or generation of a recovered clock signal and/or a recovered data signal, as described herein.

Thus, embodiments of the present disclosure provide a solution for deserialization of serial data streams that can be implemented relatively compactly in and with a greater degree of flexibility in placement and routing for PLDs. Moreover, embodiments of the present deserializers can operate relatively efficiently from a cost per performance perspective.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

I claim:

1. A system comprising:
a Grey code oscillator configured to increment a Grey code count between signal transitions in a serial data stream;
a Grey code converter configured to convert the Grey code count approximately at the signal transitions in the serial data stream to a plurality of binary counts each corresponding to a time period between one or more signal transitions in the serial data stream; and
at least one storage register configured to store a corresponding at least one calibration binary count of the plurality of binary counts and provide the at least one calibration binary count for comparison to payload binary counts of the plurality of binary counts.

2. The system of claim 1, further comprising:
at least one comparator configured to compare the payload binary counts to the at least one calibration binary count and/or a data pattern binary count and change an output state of the at least one comparator when a compared payload binary count exceeds the at least one calibration binary count and/or data pattern binary count.

3. The system of claim 2, further comprising:
a data recovery circuit comprising the at least one comparator, wherein the data recovery circuit is configured to receive the at least one calibration binary count and/or data pattern binary count and the payload binary counts and generate a recovered data signal corresponding to the serial data stream, and wherein the recovered data signal is based, at least in part, on the change in the output state of the at least one comparator.

4. The system of claim 3, wherein the serial data stream comprises an encoded data stream and the recovered data signal comprises a corresponding encoded data signal, the system further comprising:
a decoder circuit configured to receive the recovered data signal from the data recovery circuit and decode the recovered data signal into an eight bit encoded data signal;
wherein one or more of the Grey code oscillator, the Grey code converter, the at least one storage register, the at least one comparator, the data recovery circuit, and the decoder circuit are implemented entirely within a programmable logic device.

5. The system of claim 2, further comprising:
a clock recovery circuit comprising the at least one comparator, wherein the clock recovery circuit is configured to receive the at least one calibration binary count and the payload binary counts and generate a recovered clock signal corresponding to the serial data stream, and wherein the recovered clock signal is based, at least in part, on the change in the output state of the at least one comparator.

6. The system of claim 5, further comprising:
a data recovery circuit configured to receive the recovered clock signal and the serial data stream and generate a recovered data signal corresponding to the serial data stream based, at least in part, on the recovered clock signal and the serial data stream;
wherein one or more of the Grey code oscillator, the Grey code converter, the at least one storage register, the at least one comparator, the clock recovery circuit, and the data recovery circuit are implemented entirely within a programmable logic device.

7. The system of claim 1, wherein:
the Grey code oscillator is implemented entirely within a programmable logic block of a programmable logic device.

8. The system of claim 1, further comprising:
a calibration signal generator configured to receive a raw serial data stream and generate a calibration serial data stream as the serial data stream while the calibration signal generator is enabled, wherein:
the calibration serial data stream comprises a calibration period corresponding to a whole number multiple of a clock period of the raw serial data stream, and
the at least one calibration binary count in the at least one storage register corresponds to approximately half the calibration period.

9. The system of claim 1, wherein:
the Grey code oscillator comprises a first Grey code oscillator configured to increment a first Grey code count from zero between negative and adjacent positive signal transitions in the serial data stream;
the system further comprises a second Grey code oscillator configured to increment a second Grey code count from zero between positive and adjacent negative signal transitions in the serial data stream;
the Grey code converter is configured to:
convert the first Grey code count approximately at the adjacent positive signal transitions to a plurality of low binary counts each corresponding to the time period between the negative and adjacent positive signal transitions, and
convert the second Grey code count approximately at the adjacent negative signal transitions to a plurality of high binary counts each corresponding to the time period between the positive and adjacent negative signal transitions; and
the at least one storage register comprises a first storage register configured to store a corresponding first calibration binary count of the plurality of low binary counts and a second storage register configured to store a corresponding second calibration binary count of the plurality of high binary counts.

10. The system of claim 9, further comprising:
sample timing circuitry coupled between the first Grey code oscillator, the second Grey code oscillator, the Grey code converter, and/or the first and second storage registers, wherein the sample timing circuitry is configured to:
reset the first Grey code oscillator to zero upon the second Grey code oscillator reaching a first minimum Grey code count;
trigger the first storage register to store the first calibration binary count upon the second Grey code oscillator reaching a second minimum Grey code count;
reset the second Grey code oscillator to zero upon the first Grey code oscillator reaching a third minimum Grey code count; and/or
trigger the second storage register to store the second calibration binary count upon the first Grey code oscillator reaching a fourth minimum Grey code count.

11. The system of claim 9, wherein:
the first and second Grey code oscillators are each implemented entirely within a programmable logic block of a programmable logic device.

12. A method comprising:
incrementing, by a Grey code oscillator, a Grey code count between signal transitions in a serial data stream;
converting the Grey code count approximately at the signal transitions in the serial data stream to a plurality of binary counts each corresponding to a time period between one or more signal transitions in the serial data stream;
storing at least one calibration binary count of the plurality of binary counts in a corresponding at least one storage register; and
providing the at least one calibration binary count for comparison to payload binary counts of the plurality of binary counts.

13. The method of claim 12, further comprising:
comparing the payload binary counts to the at least one calibration binary count; and
changing an output state of at least one comparator when a compared payload binary count exceeds the at least one calibration binary count.

14. The method of claim 13, further comprising:
generating a recovered data signal corresponding to the serial data stream, wherein the recovered data signal is based, at least in part, on the change in the output state of the at least one comparator.

15. The method of claim 14, wherein the serial data stream comprises an encoded data stream and the recovered data signal comprises a corresponding encoded data signal, the method further comprising:
decoding the recovered data signal into an eight bit encoded data signal.

16. The method of claim 13, further comprising:
generating a recovered clock signal corresponding to the serial data stream, wherein the recovered clock signal is based, at least in part, on the change in the output state of the at least one comparator.

17. The method of claim 16, further comprising:
generating a recovered data signal corresponding to the serial data stream based, at least in part, on the recovered clock signal and the serial data stream.

18. The method of claim 12, further comprising:
receiving a raw serial data stream; and
generating a calibration serial data stream as the serial data stream, wherein the calibration serial data stream comprises a calibration period corresponding to a whole number multiple of a clock period of the raw serial data stream, and wherein the at least one calibration binary count in the at least one storage register corresponds to approximately half the calibration period of the calibration serial data stream.

19. The method of claim 12, wherein the incrementing comprises incrementing, by a first Grey code oscillator, a first Grey code count from zero between negative and adjacent positive signal transitions in the serial data stream, and incrementing, by a second Grey code oscillator, a second Grey code count from zero between positive and adjacent negative signal transitions in the serial data stream, the method further comprising:
converting the first Grey code count approximately at the adjacent positive signal transitions to a plurality of low binary counts each corresponding to the time period between the negative and adjacent positive signal transitions,
converting the second Grey code count approximately at the adjacent negative signal transitions to a plurality of high binary counts each corresponding to the time period between the positive and adjacent negative signal transitions; and
storing a first calibration binary count of the plurality of low binary counts in a first storage register and a second calibration binary count of the plurality of high binary counts in a second storage register.

20. The method of claim 19, further comprising:
resetting the first Grey code oscillator to zero upon the second Grey code oscillator reaching a first minimum Grey code count;
triggering the first storage register to store the first calibration binary count upon the second Grey code oscillator reaching a second minimum Grey code count;
resetting the second Grey code oscillator to zero upon the first Grey code oscillator reaching a third minimum Grey code count; and/or
triggering the second storage register to store the second calibration binary count upon the first Grey code oscillator reaching a fourth minimum Grey code count.

* * * * *